United States Patent
Satoh et al.

(10) Patent No.: US 9,035,449 B2
(45) Date of Patent: May 19, 2015

(54) PACKAGE MEMBER ASSEMBLY, METHOD FOR MANUFACTURING THE PACKAGE MEMBER ASSEMBLY, PACKAGE MEMBER, AND METHOD FOR MANUFACTURING PIEZOELECTRIC RESONATOR DEVICE USING THE PACKAGE MEMBER

(75) Inventors: Syunsuke Satoh, Kakogawa (JP); Naoki Kohda, Kakogawa (JP); Hiroki Yoshioka, Kakogawa (JP)

(73) Assignee: DAISHINKU CORPORATION, Kakogawa-shi (JP)

( * ) Notice: Subject to any disclaimer, the term of this patent is extended or adjusted under 35 U.S.C. 154(b) by 370 days.

(21) Appl. No.: 13/203,037

(22) PCT Filed: Apr. 2, 2010

(86) PCT No.: PCT/JP2010/056055
§ 371 (c)(1),
(2), (4) Date: Aug. 24, 2011

(87) PCT Pub. No.: WO2010/114115
PCT Pub. Date: Oct. 7, 2010

(65) Prior Publication Data
US 2012/0012356 A1  Jan. 19, 2012

(30) Foreign Application Priority Data
Apr. 3, 2009 (JP) ................ 2009-090623

(51) Int. Cl.
*H01L 21/48* (2006.01)
*H01L 23/498* (2006.01)
*H01L 41/22* (2013.01)
*H03H 9/10* (2006.01)
*H01L 41/311* (2013.01)
*H03H 3/02* (2006.01)
*H03H 9/05* (2006.01)

(52) U.S. Cl.
CPC .............. *H03H 9/1035* (2013.01); *Y10T 29/42* (2015.01); *Y10T 29/49002* (2015.01); *H01L 21/4846* (2013.01); *H01L 23/49805* (2013.01); *H01L 41/311* (2013.01); *H03H 3/02* (2013.01); *H03H 9/0595* (2013.01); *H03H 9/1014* (2013.01)

(58) Field of Classification Search
CPC .................................................... H01L 41/311
See application file for complete search history.

(56) References Cited

U.S. PATENT DOCUMENTS

| | | | | |
|---|---|---|---|---|
| 7,266,869 | B2* | 9/2007 | Hatanaka et al. | 29/25.35 |
| 7,732,995 | B2* | 6/2010 | Tsuchido et al. | 310/348 |
| 2005/0104204 | A1* | 5/2005 | Kawakubo et al. | 257/724 |
| 2006/0238080 | A1* | 10/2006 | Koyama et al. | 310/348 |
| 2008/0067892 | A1* | 3/2008 | Chiba et al. | 310/314 |

(Continued)

FOREIGN PATENT DOCUMENTS

| | | |
|---|---|---|
| JP | 05-037271 A | 2/1993 |
| JP | 08-195627 A | 7/1996 |

(Continued)

*Primary Examiner* — Stephen W Smoot
(74) *Attorney, Agent, or Firm* — Marvin A. Motsenbocker; Mots Law, PLLC

(57) ABSTRACT

[Solving means] In a package member assembly, a plurality of package members are integrally formed. The package member assembly includes a plurality of bottomed holes provided on a front main face and a back main face of a wafer made of glass, and external terminals connected to side-face conductors attached to inner wall faces of the bottomed holes on the back main face.

7 Claims, 27 Drawing Sheets

(56) References Cited

U.S. PATENT DOCUMENTS

2009/0153257 A1* 6/2009 Matsuo ............... 331/116 R
2011/0114353 A1* 5/2011 Iizuka et al. ............. 174/50.5

FOREIGN PATENT DOCUMENTS

| JP | 3413657 | B2 | 4/2003 |
| JP | 2006-005027 | A | 1/2006 |
| JP | 2006-254427 | A | 9/2006 |
| JP | 2007-067135 | A | 3/2007 |
| JP | 2007-300460 | A | 11/2007 |
| JP | 2008-061048 | A | 3/2008 |
| JP | 2008-289055 | A | 11/2008 |
| WO | WO2009/025320 | * | 2/2009 |

* cited by examiner

PACKAGE MEMBER ASSEMBLY, METHOD FOR MANUFACTURING THE PACKAGE MEMBER ASSEMBLY, PACKAGE MEMBER, AND METHOD FOR MANUFACTURING PIEZOELECTRIC RESONATOR DEVICE USING THE PACKAGE MEMBER

TECHNICAL FIELD

The present invention relates to a package member of a piezoelectric resonator device used in electronic apparatuses and the like, a package member assembly in which a plurality of package members are integrally formed, a method for manufacturing the package member assembly, and a method for manufacturing a piezoelectric resonator device using the package member.

BACKGROUND ART

Conventionally, a crystal resonator is widely used as a piezoelectric resonator device used in electronic apparatuses and the like. For example, a surface-mounted crystal resonator typically has a structure in which a crystal resonator plate is bonded via a conductive adhesive or the like to the interior portion (an inner bottom face of a recess portion) of a open-topped container member (package member) having a recess portion, and the opening portion of the container member is hermetically sealed with a plate-like cover. Here, the package of the crystal resonator is configured from a container member and a lid. Container members can be obtained, for example, by laminating and firing ceramic sheets to integrally form a plurality of container members, and separating the plurality of container members by cutting the sheets along predetermined lines.

An external terminal is formed on a bottom face of the container member, and the external terminal is connected via solder or the like to a substrate inside an electronic apparatus or the like. When such an electronic apparatus or the like is used, for example, as an in-vehicle apparatus, it may receive various types of vibrations and shocks or may be used under a high-temperature environment, and, thus, a high bond strength is required in bonding of the crystal resonator and the substrate. Thus, as a conventional method for improving the bond strength, there is a method in which a side-face conductor extended in the depth direction of the container member and connected to the external terminal is formed in a castellation on a side face of the container member, and solder is applied also to this conductor portion (see Patent Document 1 and Patent Document 2, for example).

If the container member is made of ceramic, the side-face conductor is formed as follows. First, in a state where container member are still ceramic sheets, a through hole centered about an intersecting point of boundary lines between the container members (regions in which the container members are to be formed) that are vertically and horizontally adjacent to each other is formed at the intersecting point. Then, a conductor is attached to a portion around the through hole and an inner wall face of the through hole by screen printing or plating process. After the ceramic sheets are laminated and fired, the ceramic sheets are vertically and horizontally cut along lines passing through the center of the through hole. Accordingly, a container member in which the side-face conductor is formed can be obtained. However, when forming a side-face conductor at a given position on a side face of the container member, it is necessary to increase the number of ceramic sheets laminated. In this case, the total height of the container member is increased. Furthermore, in the case of ceramic sheets, after the firing, the ceramic sheets may be contracted to cause slight displacement between laminated layers. The influence of this displacement between laminated layers reaches a measurable level when the size of a crystal resonator becomes extremely small. That is to say, displacement between laminated layers makes it difficult to form a side-face conductor having a desired shape. Accordingly, the above-described bond strength improving effect obtained by forming a side-face conductor is reduced.

As a method for solving the above-described problem of displacement between laminated layers, there is a method in which the container member is made of a material such as glass or crystal. However, it is difficult to form a side-face conductor on a side face of a container member made of such a material. The present applicant searched for prior publications having this sort of configuration, but found no publication having the same configuration at the time of filing.

PRIOR ART DOCUMENT

Patent Document

[Patent Document 1] JP 2006-5027A
[Patent Document 2] Japanese Patent No. 3413657

SUMMARY OF INVENTION

Problem to be Solved by the Invention

The present invention was made in view of these circumstances, and it is an object thereof to provide a package member assembly that can reliably form side-face conductors in package members employing glass or crystal as a base material, a method for manufacturing the package member assembly, a package member, and a method for manufacturing a piezoelectric resonator device using the package member.

Means for Solving the Problems

In order to achieve the above-described object, the present invention is directed to a package member assembly in which a plurality of package members are integrally formed, wherein a plurality of bottomed holes are formed on at least a back main face of a wafer made of glass or crystal, a plurality of external terminals having a shape of a rectangle are formed on the back main face of the wafer, and the external terminals are connected to side-face conductors attached to inner wall faces of the bottomed holes on the back main face.

With this configuration, the plurality of package members in which the side-face conductors are formed can be handled in an integrally formed state. More specifically, conductors attached to the inner wall faces of the bottomed holes function as the side-face conductors of the package members. Here, a plurality of single package members in which the side-face conductors are formed can be obtained by cutting the package member assembly along lines passing through the bottomed holes.

Furthermore, in order to achieve the above-described object, the present invention is directed to a package member employing glass or crystal as a base material and having a shape of a rectangle when viewed from above, comprising: a plurality of external terminals provided on a bottom face of the package member; and a plurality of cut-out portions cut out from an outer side face or an outer peripheral edge portion of the package member; wherein side-face conductors are attached to inner wall faces of the cut-out portions or fill the cut-out portions, and the side-face conductors are connected to the external terminals.

With this configuration, the package member is provided with the cut-out portions that are cut out from the outer side faces or outer peripheral edge portions thereof, and the side-face conductors are attached to the inner wall faces of the cut-out portions or fill the cut-out portions. Accordingly, for example, when a piezoelectric resonator device using the package member is bonded via solder to a substrate inside an electronic apparatus, the solder adheres not only to the external terminals on the bottom face of the package member but also to the side-face conductors. That is to say, in a reflow process, melted solder on the substrate not only bonds the external terminals and the substrate together but also forms solder fillets (rising portions) on the side-face conductors. Accordingly, the contact area between the piezoelectric resonator device and the solder is increased, and the piezoelectric resonator device can be supported in two directions (the planar directions of the external terminals and the side-face conductors, i.e., two directions). Accordingly, the bond strength between the piezoelectric resonator device and the substrate can be improved.

In the present invention, the cut-out portion is formed from a side face (an outer side face or an outer peripheral edge portion) of the package member to a bottom face of the package member. On the bottom face of the package member in the shape of a rectangle when viewed from above, the cut-out portion may be formed at a corner portion, a side portion, or a region including a corner portion and extending to side portions (both of long and short sides) on the bottom face of the package member.

Furthermore, in order to achieve the above-described object, in the present invention, a configuration may be adopted in which opposite sides are formed on the bottom face of the package member, and at least two external terminals are formed along the opposite sides, and the at least two external terminals are arranged so as to be symmetrical about a center of the bottom face, and so as to partially overlap each other when viewed from one side (in a direction perpendicular to the opposite sides).

With this configuration, the at least two external terminals are arranged so as to be symmetrical about a center of the bottom face. Furthermore, the at least two external terminals are arranged so as to partially overlap each other when viewed from one side. When the external terminals are arranged in such a positional relationship, the bonding reliability between the piezoelectric resonator device and a substrate inside an electronic apparatus or the like can be improved. The reason for this is that it is possible to suppress cracks caused by stress generated in solder that bonds the package member and the substrate together, the stress being generated due to a difference between their coefficients of thermal expansion. A specific description will be given below together with comparison between a conventional package member made of a ceramic material and the package member according to the present invention.

For example, in the case where a package member that is made of a ceramic material such as alumina and a substrate that is a typically used glass epoxy substrate are combined, the coefficient of thermal expansion of the substrate is larger than that of the package member. Then, when the package member (package member of the piezoelectric resonator device) and the substrate made of the above-described combination of materials are used for heat resistance application such as application in vehicles, due to exposure to a high-temperature environment, the difference between their coefficients of thermal expansion increases, and cracks easily occur in solder, and the piezoelectric resonator device may be separated at these crack portions. On the other hand, the package member according to the present invention is made of glass or crystal, and has a coefficient of thermal expansion larger than that of alumina. Accordingly, the difference between the coefficients of thermal expansion can be reduced. Furthermore, the external terminals of the package member according to the present invention are arranged on the bottom face of the package member so as to partially overlap each other when viewed from one side of the package member. That is to say, in the at least two external terminals, regions that oppose each other and regions that do not oppose each other are formed. With the regions that oppose each other, the bond strength between the piezoelectric resonator device (the package member) and the substrate can be increased, and three-dimensional twist of the piezoelectric resonator device (the package member) on the substrate can be suppressed. Meanwhile, with the regions that do not oppose each other, stress generated by the difference between the coefficients of thermal expansion of the package member and the substrate can be released. That is to say, concentration of stress on solder that is present between the package member and the substrate can be suppressed. Accordingly, the bonding reliability between the piezoelectric resonator device (the package member) and the substrate inside an electronic apparatus or the like can be improved. Furthermore, in a reflow process, melted solder on the substrate adheres not only to the external terminals but also to the side-face conductors, and, thus, the bond strength is also improved.

Furthermore, in order to achieve the above-described object, the present invention is directed to a method for manufacturing the package member assembly according to the above-described aspect of the present invention, comprising: a bottomed hole forming step of forming a plurality of bottomed holes on at least a back main face of a wafer made of glass or crystal; a vapor-deposited layer forming step of forming vapor-deposited layers at least on portions around the bottomed holes on the back main face, and on inner wall faces and inner bottom faces of the bottomed holes on the back main face; and a plated layer forming step of forming plated layers on the vapor-deposited layers on the inner wall faces of the bottomed holes on the back main face, and on the vapor-deposited layers formed continuously to said vapor-deposited layers and positioned around the bottomed holes on the back main face.

With this manufacturing method, a package member assembly in which a plurality of package members made of glass or crystal and having side-face conductors are integrally formed can be precisely formed. More specifically, in the bottomed hole forming step, for example, the bottomed holes can be formed by dry etching or wet etching. Furthermore, patterning of regions in which the external terminals and the side-face conductors are to be formed can be precisely performed, for example, using a photolithography technique.

Furthermore, with the manufacturing method, the side-face conductors having any height can be formed in the package member made of glass or crystal. The reason for this is that, with the method for manufacturing a package member assembly according to the present invention, the package members do not have to be formed by laminating and firing ceramic sheets as in conventional ceramic packages. More specifically, the bottomed holes having any depth are formed by dry etching or wet etching, conductors are attached to the inner wall faces of the bottomed holes, the package members that are adjacent to each other are then separated by cutting, and, thus, the side-face conductors having any height can be formed.

Furthermore, in order to achieve the above-described object, the present invention is directed to a method for manufacturing a piezoelectric resonator device having a package member, a piezoelectric resonator plate, and a lid, comprising: a mounting step of mounting, on a front main face side of the package member assembly according to the above-described aspect of the present invention, a plurality of piezoelectric resonator plates on which excitation electrodes are formed; a sealing step of hermetically sealing the excitation electrodes by bonding a plurality of lids to the package member assembly or the plurality of piezoelectric resonator plates; and a dividing step of cutting the package member assembly along virtual lines passing through the bottomed holes on the back main face of the package member assembly to provide a plurality of piezoelectric resonator devices.

The manufacturing method has a sealing step of hermetically sealing the excitation electrodes by bonding the plurality of lids to the package member assembly after the mounting step. This corresponds to, for example, a configuration in which, in the box-like container member (the package member) whose top is recessed, the recess portion is hermetically sealed with the plate-like lid. With this configuration, a piezoelectric resonator device having the above-described side-face conductors and having a lower total height can be obtained.

Alternatively, the manufacturing method may have a sealing step of hermetically sealing the excitation electrodes by bonding the plurality of lids to the plurality of piezoelectric resonator plates after the mounting step. This corresponds to, for example, a configuration in which, in the piezoelectric resonator plate in which the vibrating portion and the frame portion that surrounds the vibrating portion are integrated, the excitation electrodes are hermetically sealed by bonding the package member substantially in the shape of a flat plate to the front and back main faces of the frame portion. With this configuration, the bottomed hole for accommodating the piezoelectric resonator plate does not have to be formed in the package member, and, thus, an excellent efficiency for manufacturing the package member assembly is obtained.

Furthermore, with this configuration, a large number of piezoelectric resonator devices are integrally formed, and, thus, the handling becomes easy. Furthermore, the plurality of piezoelectric resonator devices can be obtained at a time by dicing, and, thus, an excellent production efficiency is obtained.

Effects of the Invention

As described above, the present invention can provide a package member assembly that can reliably form side-face conductors in package members employing glass or crystal as a base material, a method for manufacturing the package member assembly, a package member, and a method for manufacturing a piezoelectric resonator device using the package member.

DESCRIPTION OF EMBODIMENTS

First Embodiment

Hereinafter, a first embodiment of the present invention will be described with reference to the drawings. Here, in all of the following embodiments of the present invention, a description will be given using, as an example, a crystal resonator in which a crystal resonator plate is used as a piezoelectric resonator plate.

Figure 1:
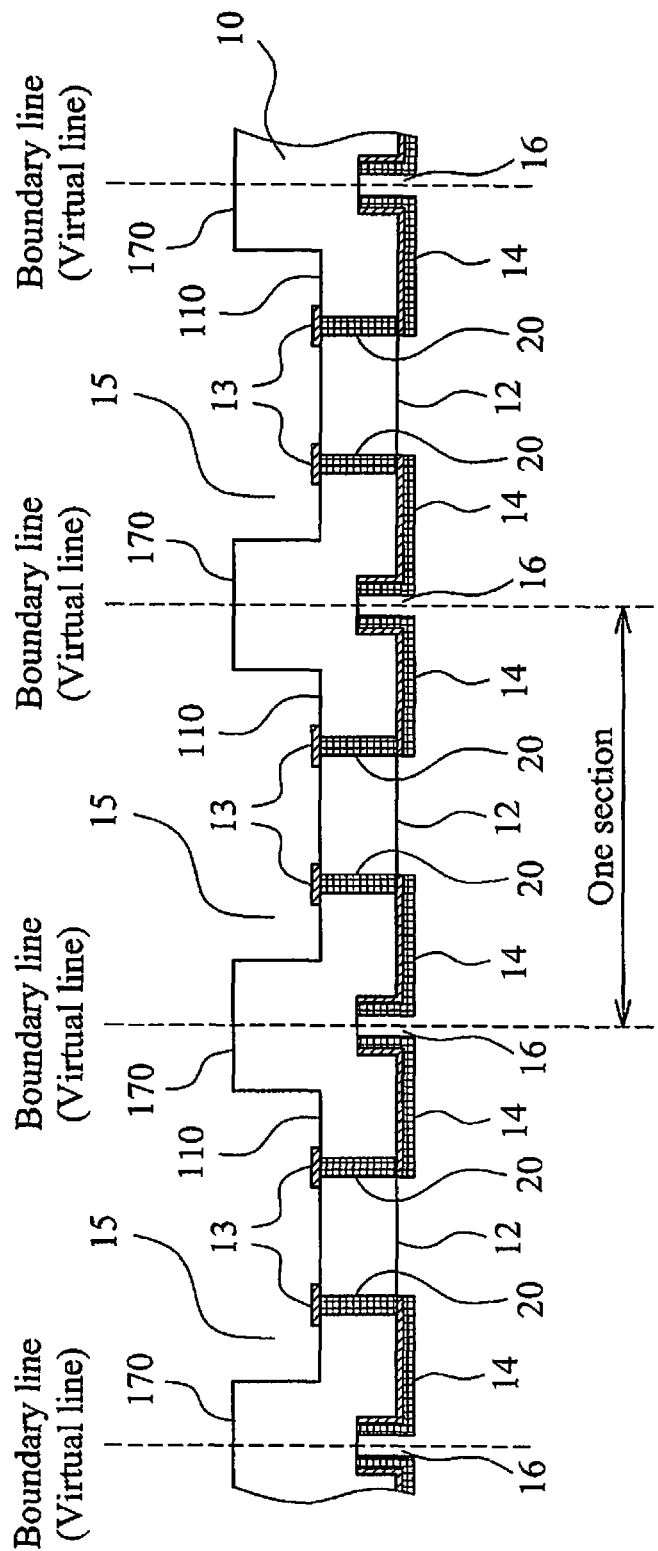
FIG. 1 is a schematic cross-sectional view of a package member assembly according to a first embodiment of the present invention.

FIG. 1 is a schematic cross-sectional view of a package member assembly according to the first embodiment. A package member assembly 10 is an assembly in which a plurality of package members 1 are integrally formed. Here, it is assumed that a region indicated as "one section" in FIG. 1 is a single package member 1 (see FIG. 2).

Figure 2:
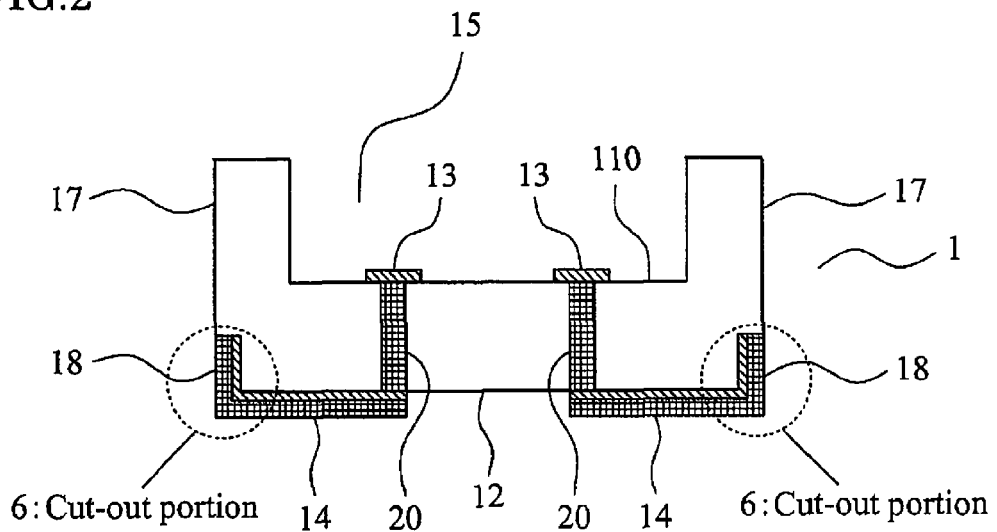
FIG. 2 is a schematic cross-sectional view of a package member according to the first embodiment of the present invention.
Figure 3:
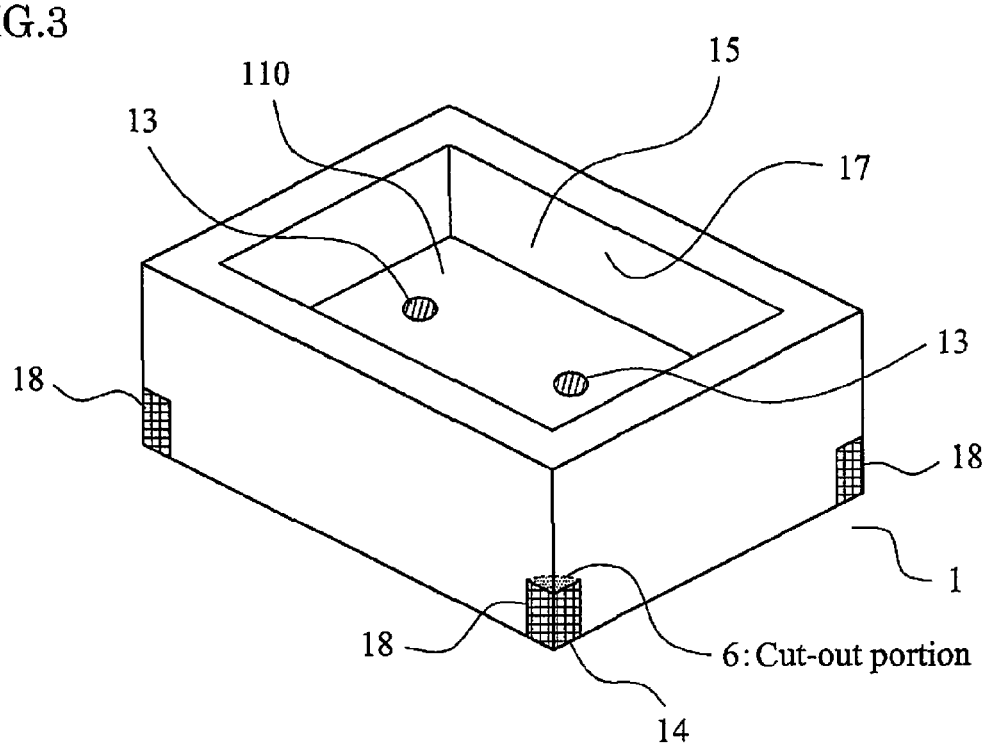
FIG. 3 is a perspective view of the package member according to the first embodiment of the present invention.

Next, a single package member 1 will be described with reference to FIGS. 2 and 3. FIG. 2 is a schematic cross-sectional view of the package member 1 according to the first embodiment. FIG. 3 is a perspective view of the package member 1 according to the first embodiment. The package member 1 is made of glass such as borosilicate glass, and is in an open-topped shape having a recess (a bottomed hole 15) when viewed in a cross-section as shown in FIG. 2. A bank portion 17 that surrounds an inner bottom face 110 of the bottomed hole 15 on every side is formed around the inner bottom face 110 of the bottomed hole 15. The inner bottom face 110 of the bottomed hole 15 has a smooth flat face, and a pair of mounting electrodes 13 are aligned thereon.

Through holes are formed through the package member 1 from the inner bottom face 110 to a bottom face 12 of the package member. The interior portions of the through holes are filled with conductors to give vias 20.

The bottom face 12 of the package member 1 has a smooth flat face, and external terminals 14 are formed thereon. Here, as shown in FIG. 2, the mounting electrodes 13 and the external terminals 14 are conductively connected to each other the vias 20. The external terminals 14 have side-face conductors 18 on the outer side faces of the package member 1 (see FIGS. 2 and 3). In this embodiment, the side-face conductors 18 are obtained by slightly engraving the outer side faces of the package member 1 inward (cut-out portions 6), and attaching conductors to the surfaces of the cut-out portions 6 (see FIG. 3).

The package member 1 is provided with the cut-out portions 6 that are cut out from points on the outer side faces (more specifically, four outer peripheral edge portions) of the package member 1 to the bottom face of the package member 1, and the portions on the inner wall faces of the cut-out portions 6 are filled with the side-face conductors 18. Accordingly, when a piezoelectric resonator device using the package member 1 is bonded via solder to a substrate inside an electronic apparatus, the solder adheres not only to the external terminals 14 on the bottom face of the package member 1 but also to the side-face conductors 18. That is to say, in a reflow process, melted solder on the substrate not only bonds the external terminals 14 and the substrate together but also forms solder fillets (rising portions) on the side-face conductors 18. Accordingly, the contact area between the piezoelectric resonator device and the solder is increased, and the piezoelectric resonator device can be supported in two directions (the planar directions of the external terminals 14 and the side-face conductors 18, i.e., two directions). Accordingly, the bond strength between the piezoelectric resonator device and the substrate can be improved.

Next, a method for manufacturing the package member assembly 10 according to the first embodiment and a method for manufacturing a crystal resonator using the package member assembly 10 will be described with reference to the drawings.

Figure 4:
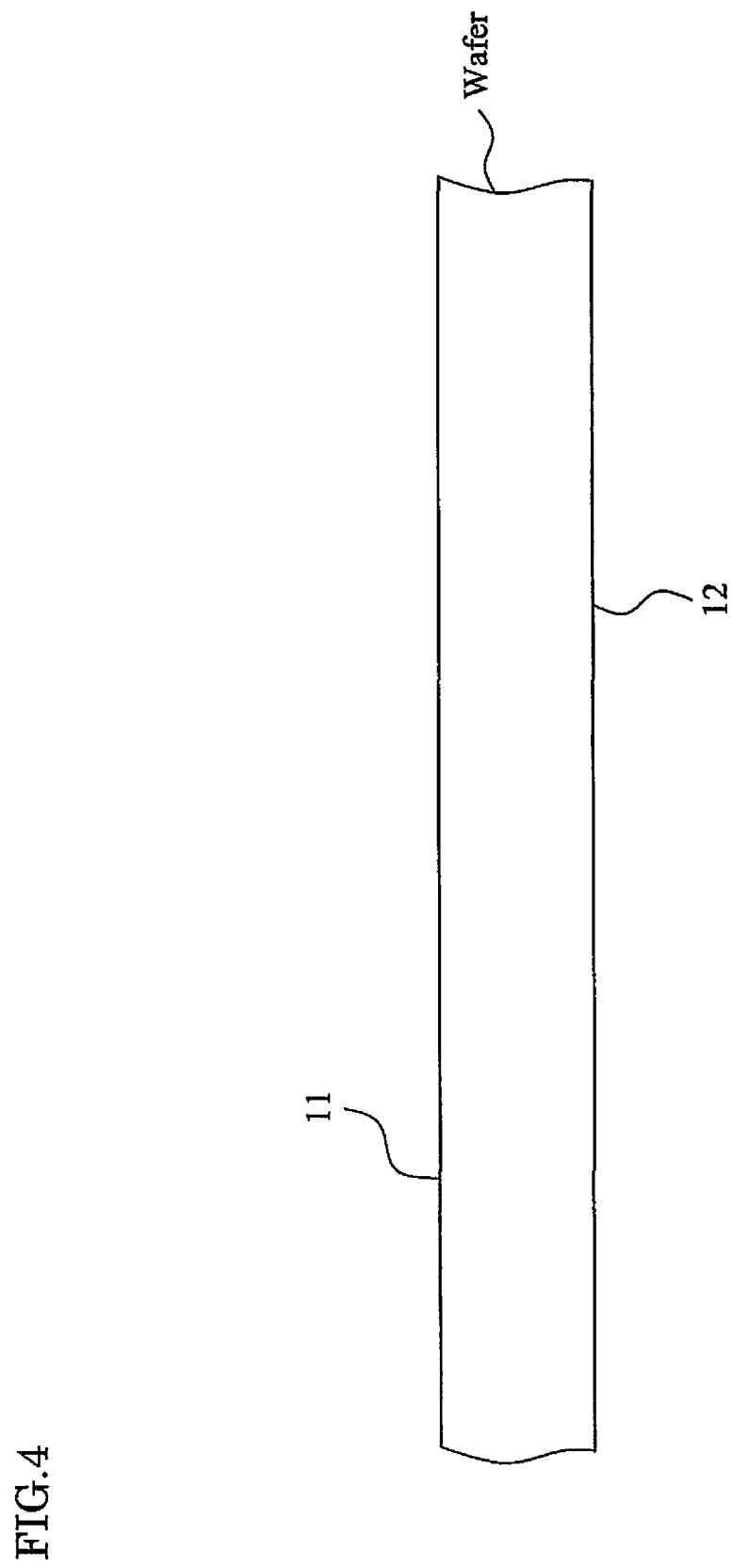
FIG. 4 is a schematic cross-sectional view showing a procedure for manufacturing a crystal resonator according to the first embodiment of the present invention.

First, a method for manufacturing the package member assembly 10 will be described. As shown in FIG. 4, a wafer is prepared. The wafer is made of glass, and a front main face 11 and a back main face 12 of the wafer have smooth flat faces. Here, in the first embodiment, a glass wafer is used, but a crystal wafer or a silicon wafer may be used.

Bottomed Hole Forming Step

Figure 5:
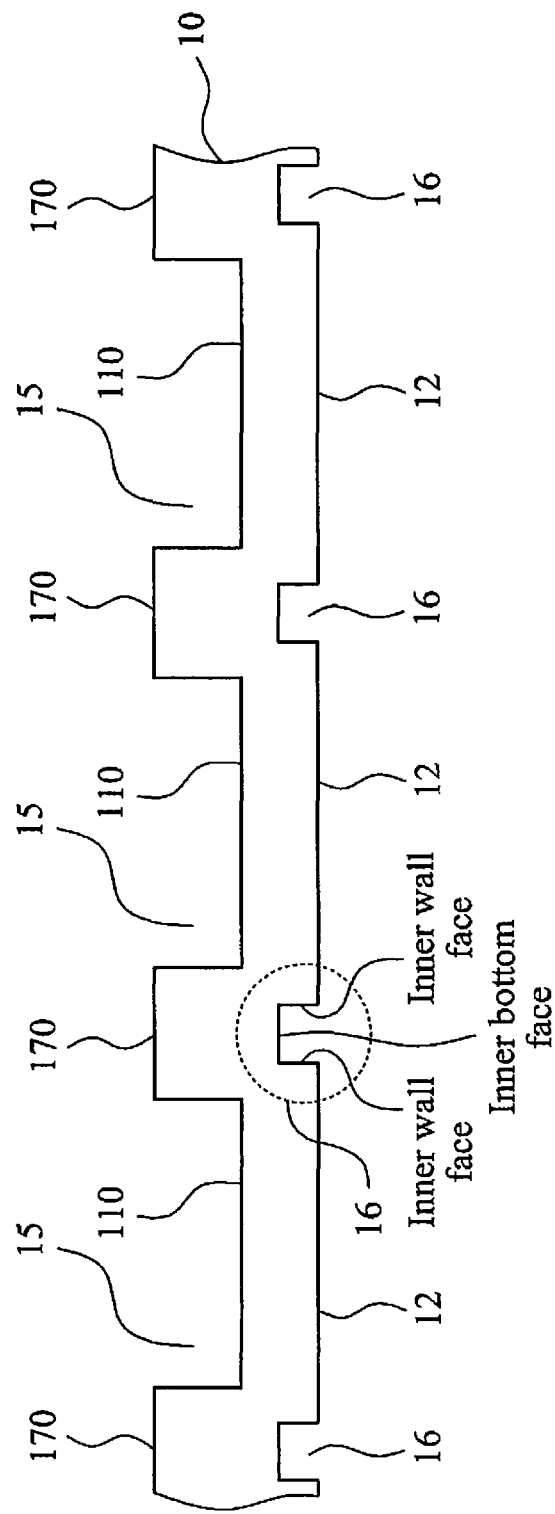
FIG. 5 is a schematic cross-sectional view showing the procedure for manufacturing the crystal resonator according to the first embodiment of the present invention.

Vapor-deposited films (not shown) are formed by vacuum deposition on the front and the back main faces of the wafer (the front main face 11 and the back main face 12). Here, the vapor-deposited films have a film configuration in which a gold layer is laminated on a chromium base layer. Next, resists (positive-type resists, in this embodiment) (not shown) are formed on the front and the back main faces 11 and 12 of the wafer. Then, after exposure is performed via masks having predetermined patterns, development is performed (not shown). Next, using the resists as protective films, portions of the vapor-deposited films that have appeared through the exposure and the development are dissolved by metal etching. Accordingly, a glass base (the front main face 11 and the back main face 12 of the wafer) appears (not shown). Here, regions of the front and the back main faces 11 and 12 of the wafer that appear through the above-described exposure, development, and metal etching are regions in which the bottomed holes 15 and bottomed holes 16 shown in FIG. 5 are to be formed.

After the metal etching, the resists are removed, and dry etching is performed (not shown). In the first embodiment, so-called reactive ion etching (RIE) is used as the dry etching. Here, the bottomed holes 15 and 16 may be formed by wet etching instead of dry etching. Accordingly, a plurality of bottomed holes 15 on the front main face 11 of the wafer and a plurality of bottomed holes 16 on the back main face 12 of the wafer are formed at positions that do not oppose each other. FIG. 5 shows a state in which, after a plurality of bottomed holes 15 and 16 are formed in the front and the back main faces 11 and 12 of the wafer in this manner, the vapor-deposited films are removed. Here, the bottomed hole 16 described above is configured from an inner wall face and an inner bottom face shown in FIG. 5.

Figure 6:
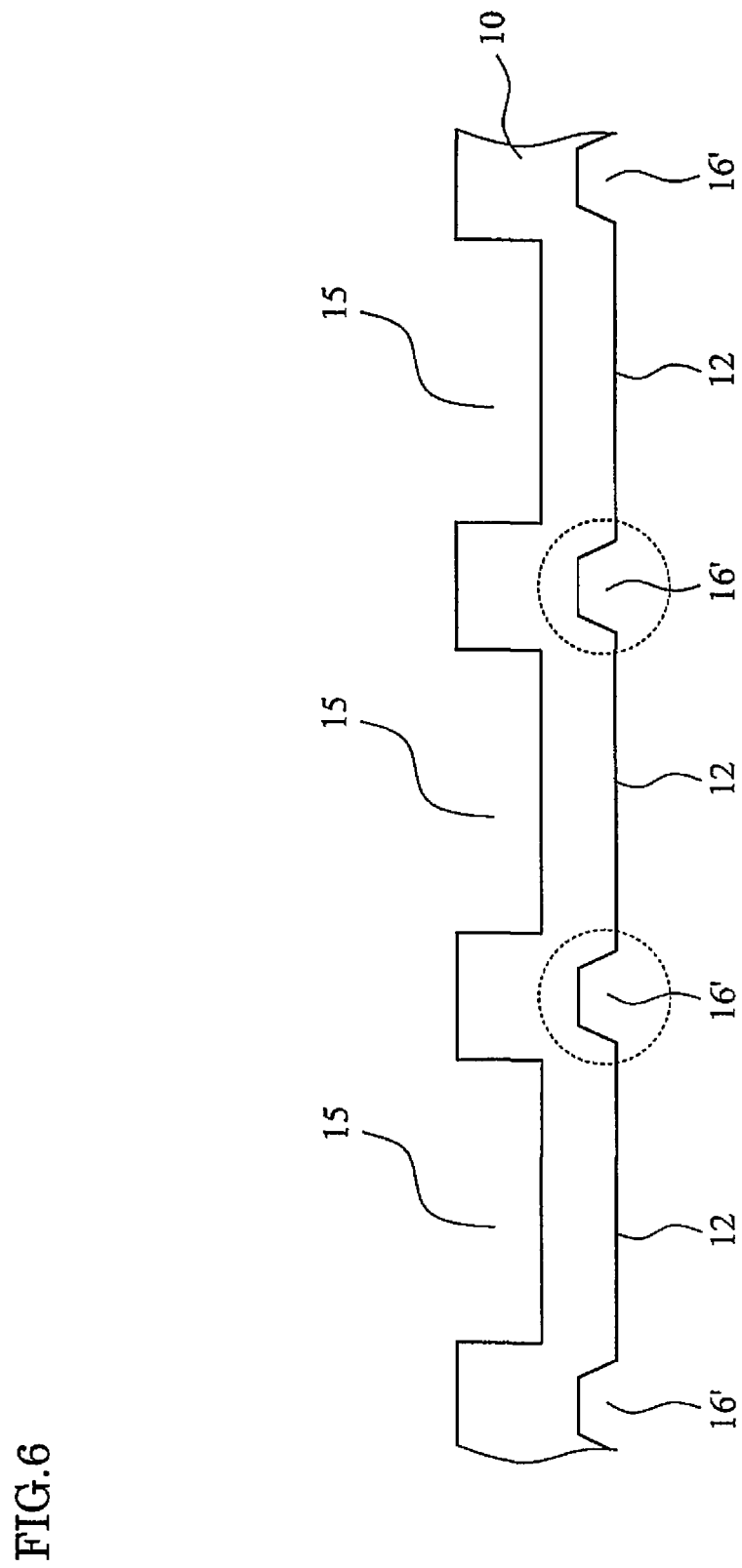
FIG. 6 is a schematic cross-sectional view of bottomed holes according to a modified example of the present invention.

As a modified example of the bottomed hole 16 according to the first embodiment, a bottomed hole 16' having a shape as shown in FIG. 6 is also possible. In FIG. 6, the bottomed hole 16' has a cross-sectional shape in which the size of the opening portion increases in a tapered manner. The bottomed hole 16' shown in FIG. 6 has an opening diameter larger than that of the bottomed hole 16 shown in FIG. 5. Accordingly, for example, a new plating solution during electroplating can be circulated well into the interior portion of the bottomed hole 16'. That is to say, in a plated layer forming step described later, a plated layer can be more stably formed inside the bottomed hole 16'. Here, the present invention is not limited to the shape of the bottomed hole 16' shown in FIG. 6, and, for example, a shape is also possible in which, when viewed in a cross-section, the bottomed hole has a substantially rectangular portion from the inner bottom face toward the back main face 12 by any depth, and has an opening diameter increasing in a tapered manner from that point to the back main face 12.

Via Forming Step

Figure 7:
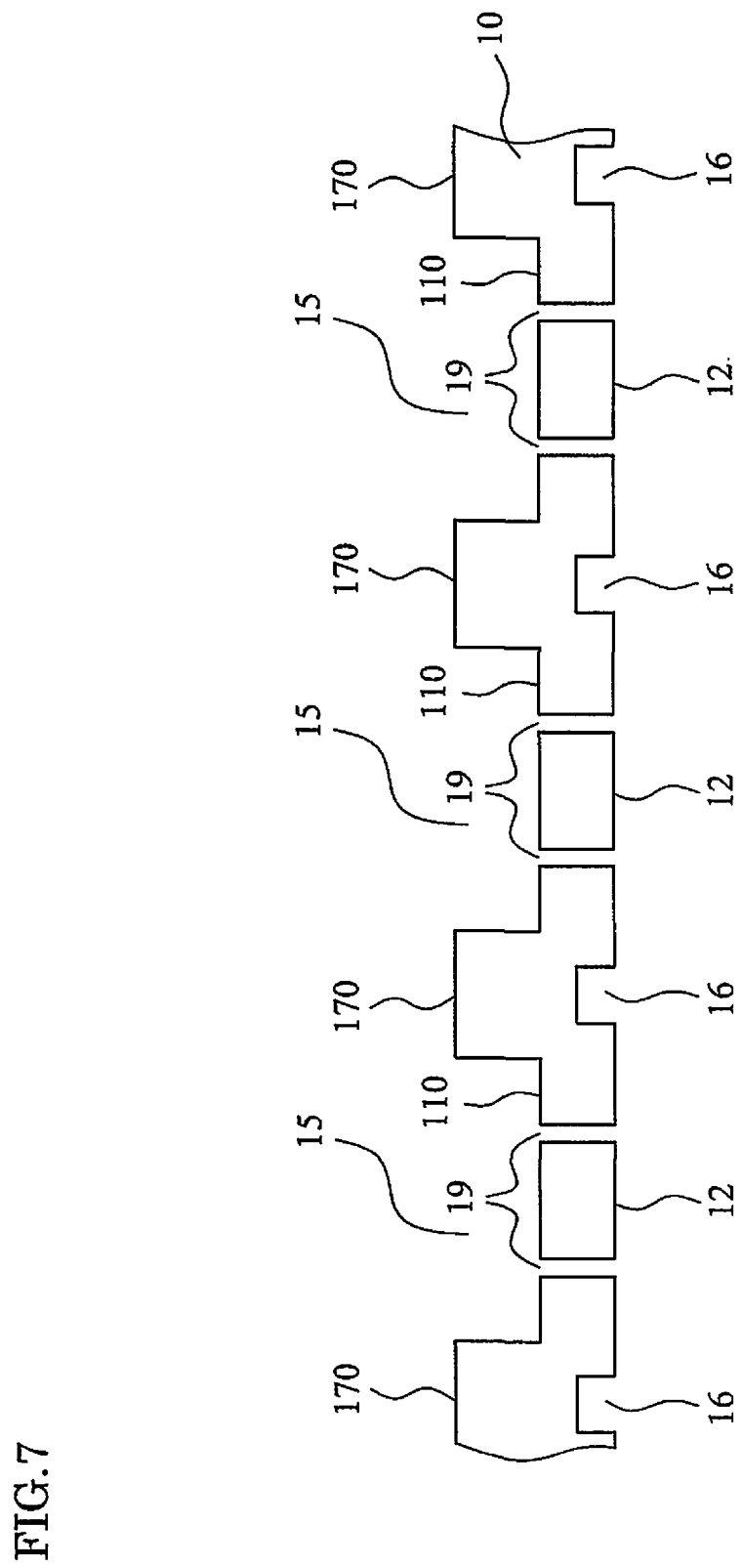
FIG. 7 is a schematic cross-sectional view showing the procedure for manufacturing the crystal resonator according to the first embodiment of the present invention.

Next, as shown in FIG. 7, through holes 19 that pass from the inner bottom face 110 to the back main face 12 are formed at two points in a one-section region in which a package member 1 is to be formed. In the first embodiment, the through holes 19 are formed by dry etching, but the through holes 19 may be formed by wet etching instead of dry etching.

Next, a metal film in which a gold layer is formed on a chromium base layer is formed by sputtering as a seed layer (not shown) during electroplating on the inner wall faces of the through holes 19. Here, in the first embodiment, the seed layer is formed by sputtering, but it may be formed by vacuum deposition. Then, on this film, a tin-plated layer and a gold-plated layer are formed and laminated using an electroplating method (not shown). Here, the tin-plated layer and the gold-plated layer may be formed as a gold-tin alloy-plated layer instead of separate layers. Here, in the case where a gold-plated layer is laminated on a tin-plated layer as in this embodiment, an ultrathin gold-plated layer (gold strike plated layer) is formed as a seed layer on the tin-plated layer.

Figure 8:
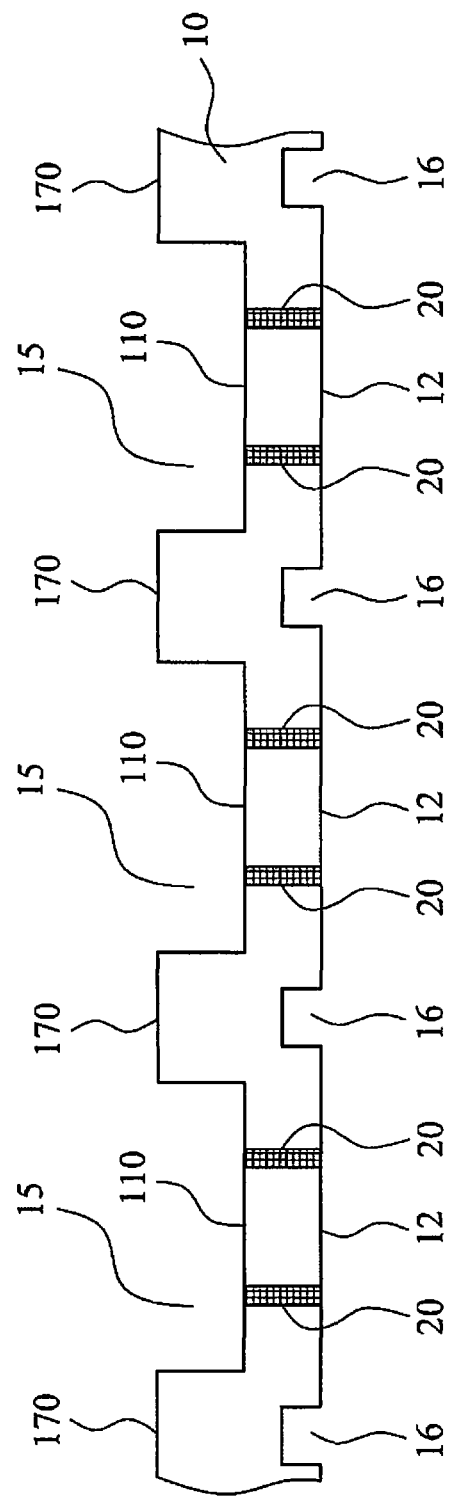
FIG. 8 is a schematic cross-sectional view showing the procedure for manufacturing the crystal resonator according to the first embodiment of the present invention.

The vapor-deposited film and the plated layer are melted by application of heat and thus integrated in an atmosphere heated to a predetermined temperature. Accordingly, the interior portions of the through holes 19 are filled with conductors (see FIG. 8). Accordingly, the vias 20 are formed.

Vapor-Deposited Layer Forming Step

Figure 9:
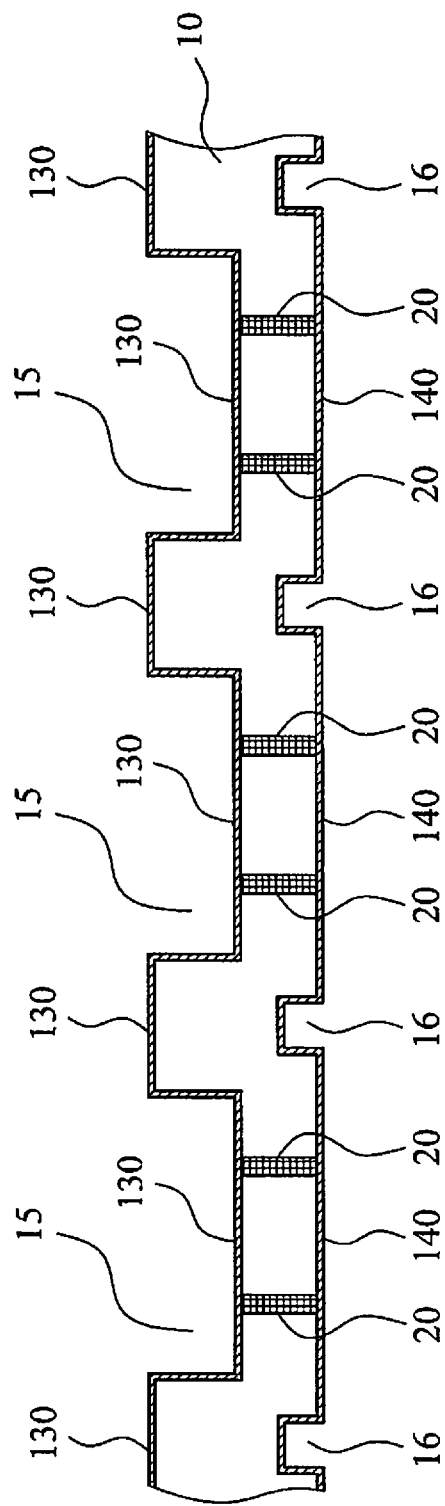
FIG. 9 is a schematic cross-sectional view showing the procedure for manufacturing the crystal resonator according to the first embodiment of the present invention.

Next, a vapor-deposited layer 140 is formed at a time on the entire back main face 12 (including the inner wall faces and the inner bottom faces of the bottomed holes 16). Furthermore, a vapor-deposited layer 130 is formed on the entire front main face 11 (including the inner bottom faces 110 of the bottomed holes 15) (see FIG. 9). The vapor-deposited layers 130 and 140 are formed by vacuum deposition, and have a film configuration in which a gold layer is laminated on a chromium base layer. The vapor-deposited layers 130 and 140 are formed at the upper end portions and the lower end portions of the vias 20, and the vapor-deposited layer 130 and the vapor-deposited film 140 are conductively connected via the vias 20.

Partially Removing Step

Figure 10:
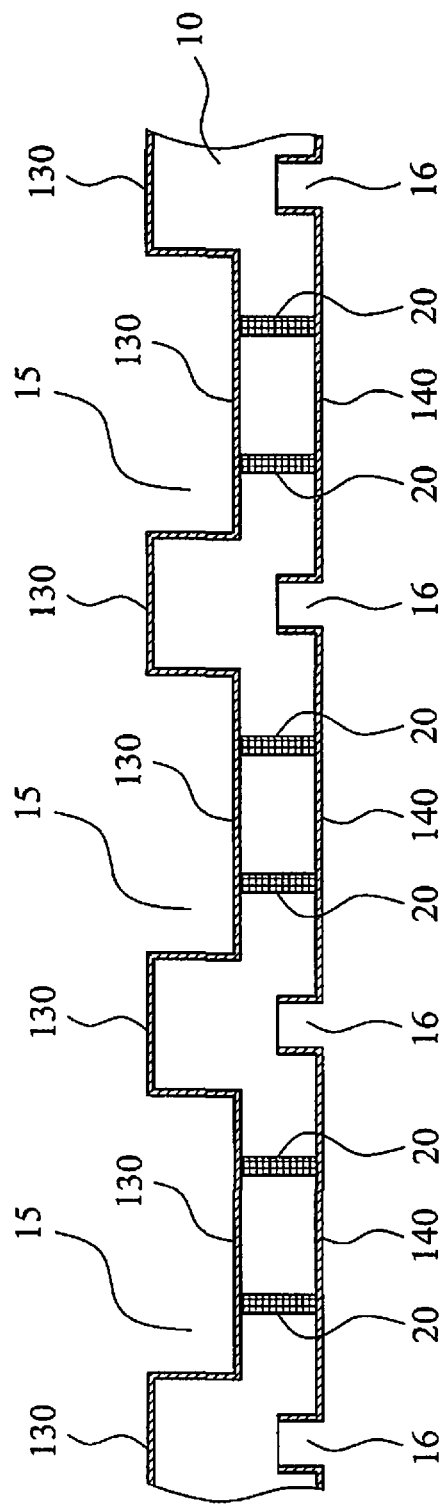
FIG. 10 is a schematic cross-sectional view showing the procedure for manufacturing the crystal resonator according to the first embodiment of the present invention.

Next, as shown in FIG. 10, the vapor-deposited layer 140 is removed from the inner bottom faces of the bottomed holes 16 on the back main face 12. In the first embodiment, the vapor-deposited layer 140 is removed from the inner bottom faces of the bottomed holes 16 using a photolithography technique. In this partially removing step, the vapor-deposited layer 140 on the inner bottom faces is completely removed, but it may be removed only partially. That is to say, in a dividing step described later, only part of the vapor-deposited layer 140 on the inner bottom faces positioned on a virtual line at which the package member assembly 10 is to be cut by dicing (or in a dicing blade width or more) may be removed.

Figure 11:
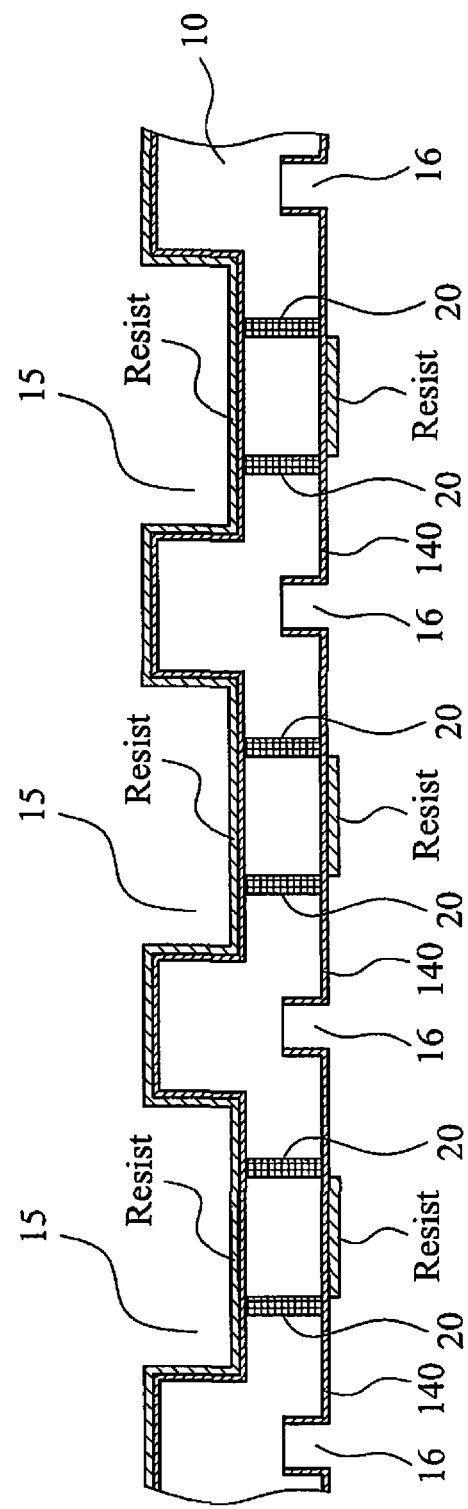
FIG. 11 is a schematic cross-sectional view showing the procedure for manufacturing the crystal resonator according to the first embodiment of the present invention.

Next, as shown in FIG. 11, resists are formed on the bottomed holes 15 on the front main face 11 side and on part of the vapor-deposited layer 140 on the back main face 12 side.

Plated Layer Forming Step

Figure 12:
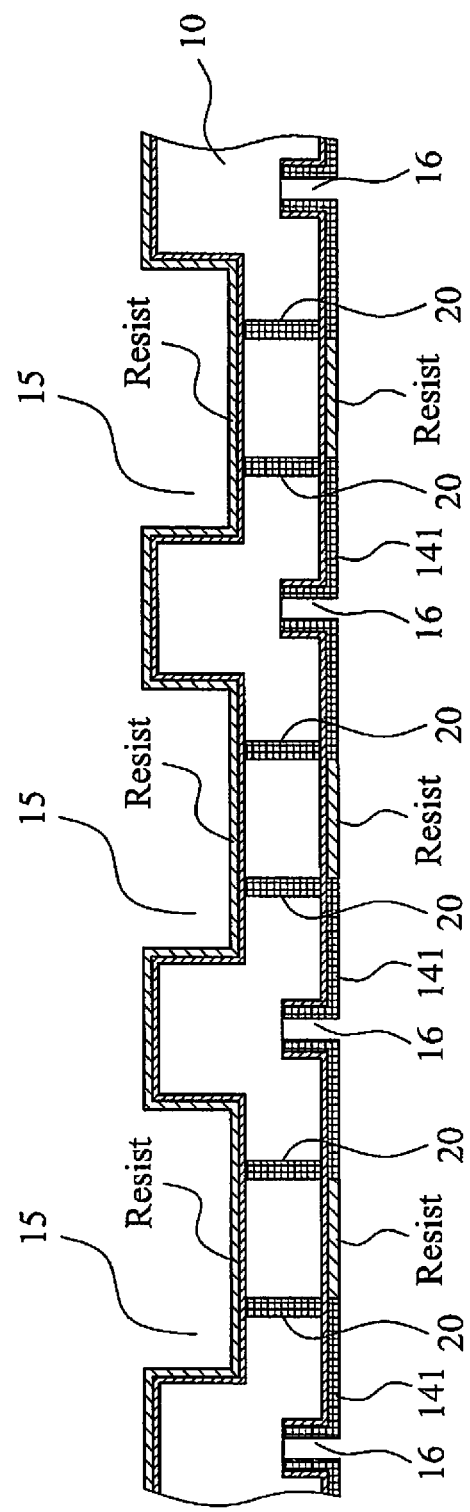
FIG. 12 is a schematic cross-sectional view showing the procedure for manufacturing the crystal resonator according to the first embodiment of the present invention.

Then, a plated layer 141 is formed on the vapor-deposited layer 140 (regions of the vapor-deposited layer on which external terminals are finally formed) using an electroplating method (see FIG. 12). In the first embodiment, the plated layer 141 is made of gold.

Next, the resists on the vapor-deposited layer 130 and the vapor-deposited layer 140 are removed. Then, patterning of the vapor-deposited layer 130 formed on the inner bottom faces 110 of the bottomed holes 15 is performed using a photolithography technique such that only regions of the vapor-deposited layer 130 at the upper end portions of the vias 20 and around the upper end portions remain. Accordingly, the mounting electrodes 13 are formed. Furthermore, the vapor-deposited layer 140 under the resists on the back main face 12 side is removed by metal etching.

Figure 13:
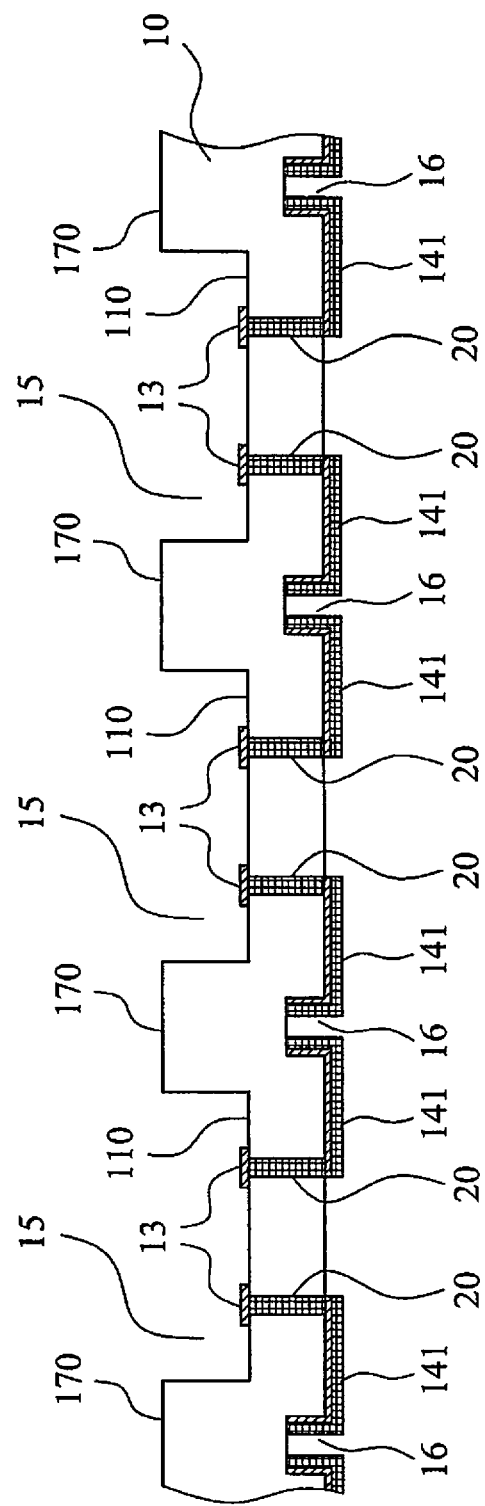
FIG. 13 is a schematic cross-sectional view showing the procedure for manufacturing the crystal resonator according to the first embodiment of the present invention.

In this manner, the package member assembly 10 in which the plurality of package members 1 are aligned in a matrix and integrally formed is completed (see FIG. 13). Here, in the first embodiment, resist removal and metal etching are performed after the plated layer forming step, but a procedure may be adopted in which, before forming the plated layer, patterning of the vapor deposited layer is performed by exposure and development, the resist is then removed, a resist is formed again so as not to cover a region on which a plated layer is to be formed, and then electroplating is performed.

Next, a method for manufacturing crystal resonators 5 (see FIG. 17) using the package member assembly 10 will be described.

Mounting Step

Figure 14:
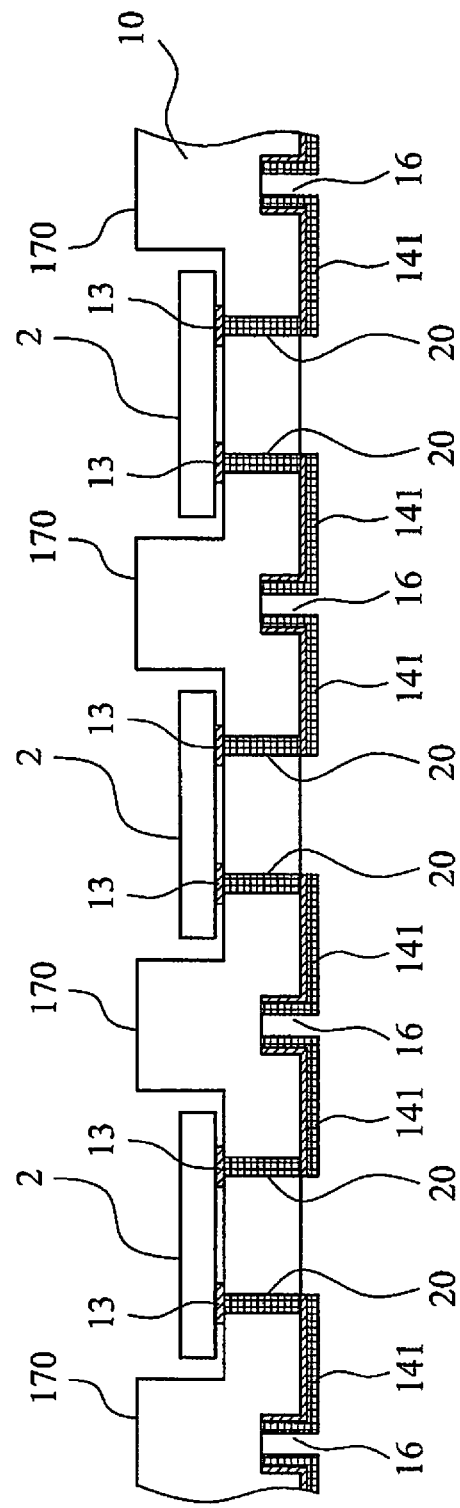
FIG. 14 is a schematic cross-sectional view showing the procedure for manufacturing the crystal resonator according to the first embodiment of the present invention.

A plurality of crystal resonator plates 2 are mounted on the front main face side of the package member assembly 10. More specifically, the crystal resonator plates 2 are positioned and placed respectively on the regions of the package members 1 (inside the bottomed holes 15) of the package member assembly 10 by an image recognizing means such that one crystal resonator plate is placed on one package member (see FIG. 14). The crystal resonator plates 2 are AT-cut crystal pieces that have been cut at a predetermined angle, and excitation electrodes, lead electrodes, and the like are formed thereon. In FIG. 14, the excitation electrodes, the lead electrodes, and the like are not shown.

Temporary Bonding Step

After the positioning and placing, in a state where an ultrasonic horn has been brought into contact with the crystal resonator plates 2, ultrasonic waves together with pressure are applied. Accordingly, the crystal resonator plates 2 (bonding electrodes at end portions of the lead electrode) are temporarily bonded to the mounting electrodes 13. Here, in the temporary bonding, the crystal resonator plates 2 and the mounting electrodes 13 are bonded to each other via brazing filler metal (not shown). In the first embodiment, gold-tin alloy is used.

Permanent Bonding Step

After the temporary bonding step, the brazing filler metal and the metal films (the mounting electrodes 13 and the bonding electrodes of the crystal resonator plates 2) are melted by application of heat and thus integrated in an atmosphere heated to a predetermined temperature.

Sealing Step

Figure 15:
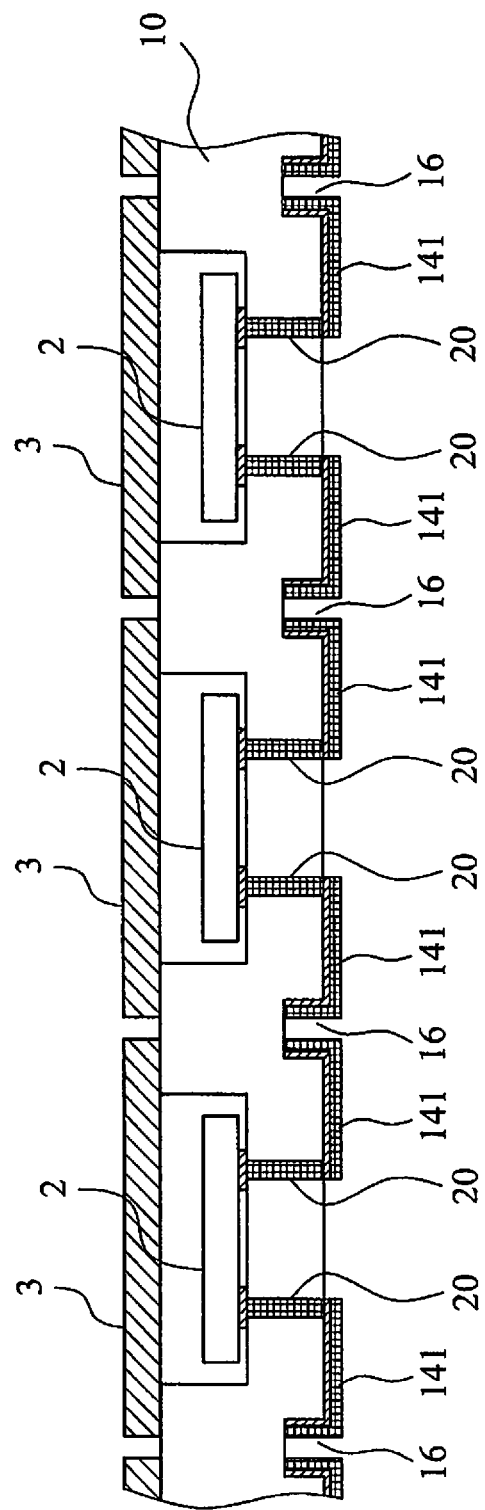
FIG. 15 is a schematic cross-sectional view showing the procedure for manufacturing the crystal resonator according to the first embodiment of the present invention.
Figure 16:
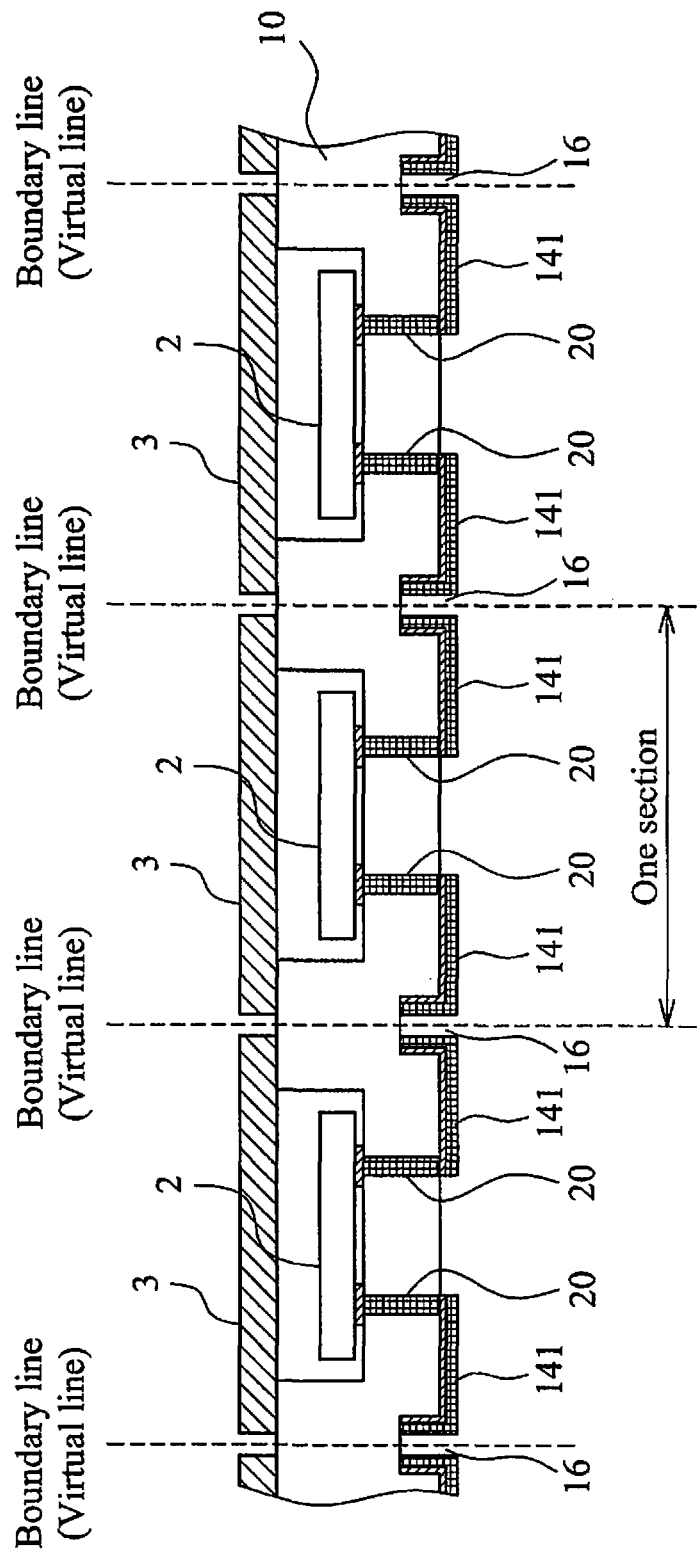
FIG. 16 is a schematic cross-sectional view showing the procedure for manufacturing the crystal resonator according to the first embodiment of the present invention.
Figure 17:
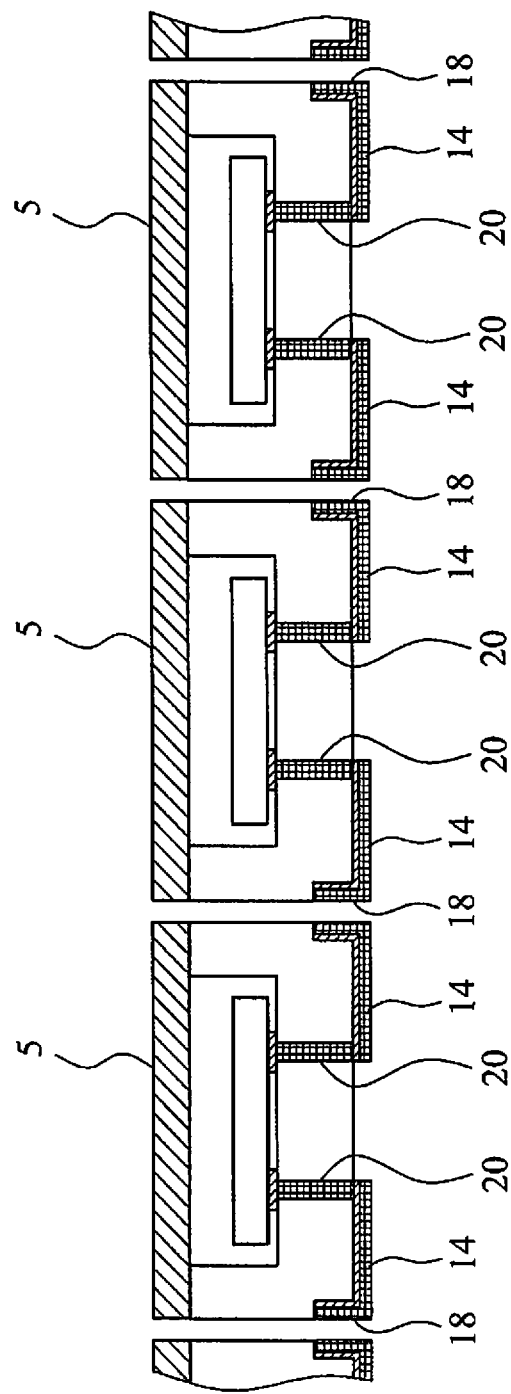
FIG. 17 is a schematic cross-sectional view showing the procedure for manufacturing the crystal resonator according to the first embodiment of the present invention.

As shown in FIG. 15, a plurality of lids 3 are bonded to upper faces 170 (see FIG. 14) of the bank portions of the package member assembly 10 via the brazing filler metal (not shown in FIGS. 15 to 17). In this embodiment, gold-tin alloy is used as the brazing filler metal. Here, the lids 3 are made of glass or crystal, and are rectangular when viewed from above. When the lids 3 are bonded to the upper faces 170 of the bank portions of the package member assembly 10, the excitation electrodes formed on the crystal resonator plates 2 are hermetically sealed. In the first embodiment, the package member assembly 10 and the crystal resonator plates 2 are temporarily bonded to each other, and the package member assembly 10 and the lids 3 are bonded to each other, in a vacuum atmosphere, but the bonding may be performed in an inactive gas atmosphere such as a nitrogen atmosphere.

Dividing Step

After the permanent bonding step, the package member assembly 10 is cut by dicing along virtual lines (boundary lines) that are formed from the front main face 11 of the wafer to the back main face 12 so as to pass through the bottomed holes 16 on the back main face side (the back main face 12 side of the wafer) of the package member assembly 10 as shown in FIG. 16. More specifically, the package members 1 that are adjacent to each other in the package member assembly 10 are separated by cutting by dicing, and, thus, the plurality of crystal resonators 5 having the side-face conductors 18 can be obtained at a time (see FIG. 17).

According to the manufacturing method, the package member assembly 10 in which the plurality of package members 1 made of glass and having the side-face conductors 18 are integrally formed can be precisely formed. More specifically, in the bottomed hole forming step, for example, the bottomed holes 15 and 16 can be formed by dry etching or wet etching. Furthermore, patterning of regions in which the external terminals 14 and the side-face conductors 18 are to be formed can be precisely performed, for example, using a photolithography technique.

Furthermore, according to the manufacturing method, the side-face conductors 18 having any height can be formed in the package member 1 made of glass or crystal. The reason for this is that, with the method for manufacturing the package member assembly 10 according to the first embodiment, the package members 1 do not have to be formed by laminating and firing ceramic sheets as in conventional ceramic packages. More specifically, the bottomed holes 16 having any depth are formed by dry etching or wet etching, conductors are attached to the inner wall faces of the bottomed holes 16, the package members 1 that are adjacent to each other are then separated by cutting, and, thus, the side-face conductors 18 having any height can be formed.

Furthermore, the manufacturing method has a sealing step of hermetically sealing the excitation electrodes formed on the crystal resonator plates 2 by bonding the plurality of lids 3 to the package member assembly 10 after the mounting step. For example, as in the above-described embodiment, in a configuration in which, after the crystal resonator plates 2 are accommodated in the recess portions (the bottomed holes 15), the recess portions are hermetically sealed with the plate-like lids 3, piezoelectric resonator devices having the side-face conductors and having a lower total height can be obtained.

Furthermore, according to the manufacturing method, a large number of crystal resonators 5 are integrally formed, and, thus, the handling becomes easy. Furthermore, the plurality of crystal resonators 5 can be obtained at a time by dicing, and, thus, an excellent production efficiency is obtained.

Furthermore, with the configuration of the crystal resonator 5 according to the first embodiment, the package member 1 is provided with the plurality of cut-out portions 6 that are cut out from (points on) the outer side faces of the package member 1 to the bottom face of the package member 1, and the portions on the inner wall faces of the cut-out portions 6 are filled with the side-face conductors 18. Accordingly, when the crystal resonator 5 using the package member 1 is bonded via solder to a substrate inside an electronic apparatus, as shown in FIG. 17, the solder adheres not only to the external terminals 14 on the bottom face of the package member 1 but also to the side-face conductors 18. That is to say, in a reflow process, melted solder on the substrate not only bonds the external terminals 14 and the substrate together but also forms solder fillets (rising portions) on the side-face conductors 18. Accordingly, the contact area between the crystal resonator 5 and the solder is increased, and the crystal resonator 5 can be supported in two directions (the planar directions of the external terminals 14 and the side-face conductors 18, i.e., two directions). Accordingly, the bond strength between the crystal resonator 5 and the substrate can be improved.

Figure 18:
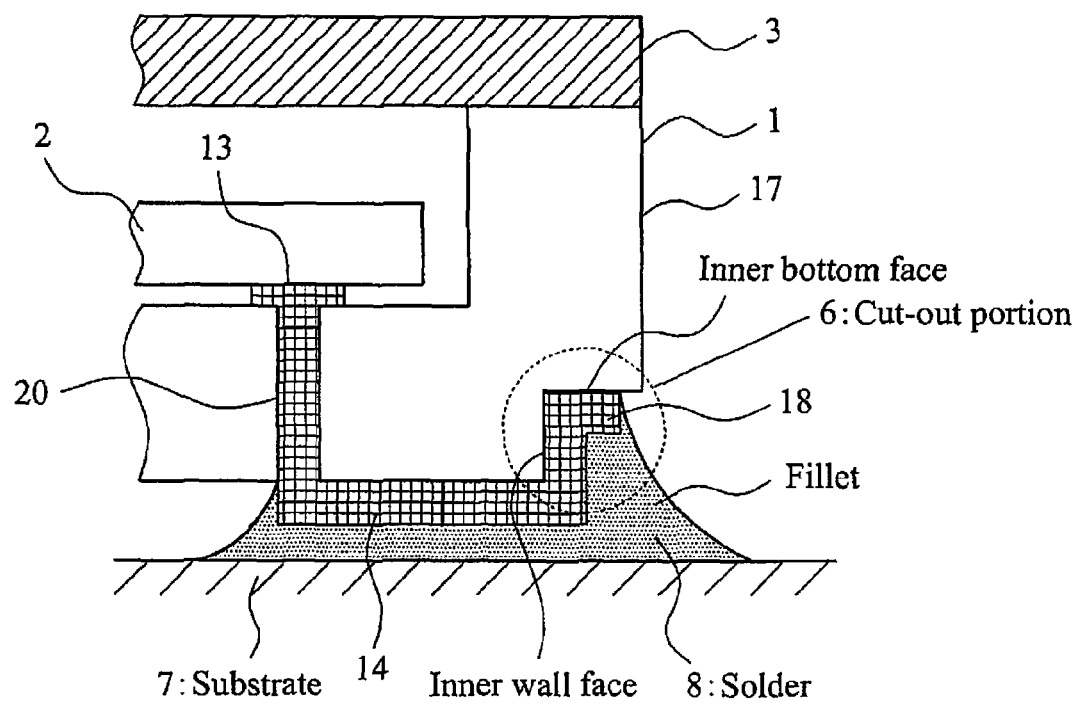
FIG. 18 is a partially enlarged cross-sectional view of a side-face conductor according to the first embodiment of the present invention.

Here, in the first embodiment, as shown in FIGS. 2, 3, and 17, the side-face conductor 18 is formed on substantially the same line as the outer side face of the package member 1 (the outer side face of the bank portion 17) in the vertical direction. However, the present invention is not limited to this structure, and, for example, as shown in FIG. 18, the outer side face of the package member 1 (the outer side face of the bank portion 17) may be projected more outward than the side-face conductor 18. Furthermore, as shown in FIG. 18, the side-face conductor 18 may be formed not only on the inner wall face of the bottomed hole 16 but also on the inner bottom face. With the thus configured side-face conductors 18, when the crystal resonator 5 is bonded to the substrate in the reflow process, the amount of solder 8 adhering to the side-face conductors 18 is larger than in the configuration as in FIG. 2, and the solder 8 adheres to more faces (more specifically, also to inner bottom faces). Accordingly, the bond strength between the crystal resonator 5 and the substrate 7 can be further improved. Here, in FIG. 18, for the sake of convenience of the description, faces on which the side-face conductor 18 is formed are shown as the inner bottom face and the inner wall face of the bottomed hole 16 before the dividing step.

Second Embodiment

Figure 19:
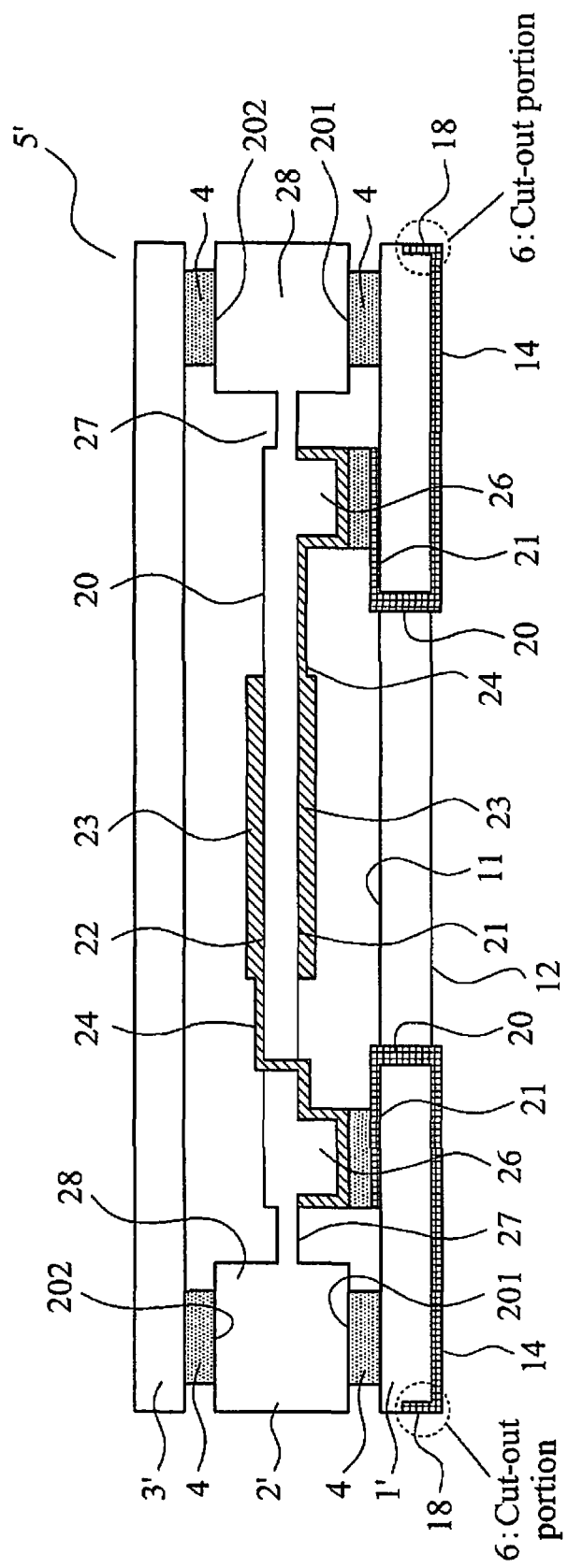
FIG. 19 is a schematic cross-sectional view of a crystal resonator according to a second embodiment of the present invention.

Hereinafter, a second embodiment of the present invention will be described. Here, the same portions of the configuration as those in the first embodiment are not described, and have the same effects as those in the first embodiment. FIG. 19 is a schematic cross-sectional view of a crystal resonator 5' according to the second embodiment.

The crystal resonator 5' shown in FIG. 19 has, as main constituent elements, a crystal resonator plate 2' that has a frame portion 28, and a package member 1' and a lid 3' (package member) that are bonded to the front and back of the crystal resonator plate 2'. The package member 1' and the lid 3' are bonded to front and back main faces 201 and 202 of the frame portion 28 of the crystal resonator plate 2' via bonding materials 4 made of a brazing filler metal and a metal film. Here, in FIG. 19, Z-plate quartz crystal is used as base materials for the package member 1' and the lid 3'.

The crystal resonator plate 2' is an AT-cut crystal piece, and has a configuration in which a vibrating portion 20 that is a thin region on which excitation electrodes 23 are formed, a protruding portion 26 that is formed on the outer peripheral region of one main face (hereinafter, referred to as a "first main face") 21 of the vibrating portion 20, a thin portion 27, and the frame portion 28 are integrally formed. Here, the frame portion 28 surrounds the vibrating portion 20 on every side, and formed thicker than the vibrating portion 20. Furthermore, the thin portion 27 is formed between the vibrating portion 20 and the frame portion 28, and is formed thinner than the vibrating portion 20.

The excitation electrodes 23 are formed by vacuum deposition, and have a film configuration in which chromium and gold are laminated in this order from the main face side of the vibrating portion 20. Here, the present invention is not limited to the film configuration of the excitation electrodes 23, and other film configurations may be employed. Lead electrodes 24 are extended respectively from the excitation electrodes 23 on the front and the back main faces (the first main face 21 and the other main face (hereinafter, referred to as a "second main face") 22) of the vibrating portion 20. The lead electrode 24 drawn from the excitation electrode 23 on the second main face 22 side passes through the vibrating portion 20 in the thickness direction and extended to the first main face 21 side. Then, the lead electrode 24 extended to the first main face 21 side is extended so as to cover the surface of the protruding portion 26 (the left protruding portion 26 in FIG. 19). Meanwhile, the lead electrode 24 drawn from the excitation electrode 23 on the first main face 21 side is extended so as to cover the surface of the protruding portion 26 (the right protruding portion 26 in FIG. 19). The end portions of the lead electrodes 24 drawn to the protruding portion 26 are bonded by melting a brazing filler metal and a metal film to an electrode pattern 21 formed on one main face (hereinafter, referred to as a "first main face") 11 of the package member 1'. In FIG. 19, the external terminals 14 are rectangular when viewed from above, and formed on short side edge portions and the vicinity thereof of the other main face 12 (bottom face) of the package member 1'. The external terminals 14 are formed so as to be connected to the vias 20, and are electrically connected via the electrode pattern 21 and the like finally to the excitation electrodes 23.

In FIG. 19, the outer peripheral end portions of the external terminals 14 are connected to the side-face conductors 18. The external terminals 14 have a film configuration in which chromium and gold vapor-deposited layers and a gold-plated layer are laminated in this order on the crystal base. The side-face conductors 18 are formed by a method similar to that of the crystal resonator 5 in the first embodiment described above except for partial steps. More specifically, the structure of the package member assembly 10 is different from that in the first embodiment described above. That is to say, the step of forming the bottomed hole 15 for accommodating the crystal resonator plate 2' (the crystal resonator plates 2, in first embodiment) in the package member 1' (the package members 1, in first embodiment) is not necessary (contrary to the first embodiment, only the bottomed holes 16 and the through holes 19 are formed in the second embodiment). Accordingly, an improved efficiency for manufacturing the package member assembly 10 is obtained.

With the configuration of the crystal resonator 5 according to the second embodiment, when the crystal resonator plate 2' in which the vibrating portion 20 and the frame portion 28 are integrated is bonded via the bonding material 4 to the substantially plate-like package member 1', a recess portion (the bottomed hole 15, in first embodiment) for accommodating the crystal resonator plate 2' does not have to be formed on the first main face side of the package member 1', and, thus, an excellent efficiency for manufacturing the package member assembly 10 is obtained.

In FIG. 19, the side-face conductors 18 are formed to a height that does not reach the first main face 11 of the package member 1'. The reason for this is that the method for manufacturing the package member assembly 10 according to the present invention is used. That is to say, with the method for manufacturing a package member assembly according to the present invention, the side-face conductors 18 having any height can be formed in the package members 1' made of glass or crystal. That is to say, with the method for manufacturing the package member assembly 1' according to the present invention, the bottomed holes 16 having any depth are formed by dry etching or wet etching, conductors are attached to the inner wall faces of the bottomed holes 16, the package members 1' that are adjacent to each other are then separated by cutting, and, thus, the side-face conductors 18 having any height can be formed.

Figure 20:
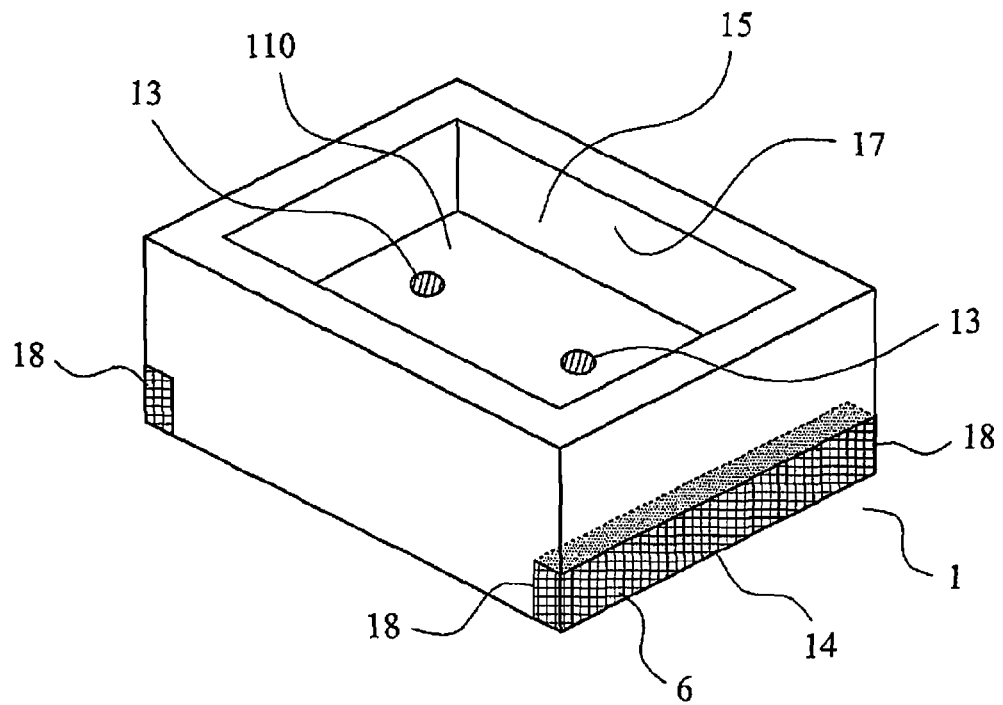
FIG. 20 is a perspective view of a package member showing an exemplary arrangement of external terminals of the present invention.

Here, in the above-described embodiments of the present invention, the number of external terminals 14 formed is four in the first embodiment, and is two in the second embodiment. For example, in the case of two terminals, as shown in FIG. 20, the side-face conductors 18 having a length across an entire short side of the package member 1 may be formed. In the case of the configuration in which the side-face conductors 18 are extended in the shape of bands in this manner, the solder contact area is increased, and, thus, the bond strength is improved.

Figure 21:
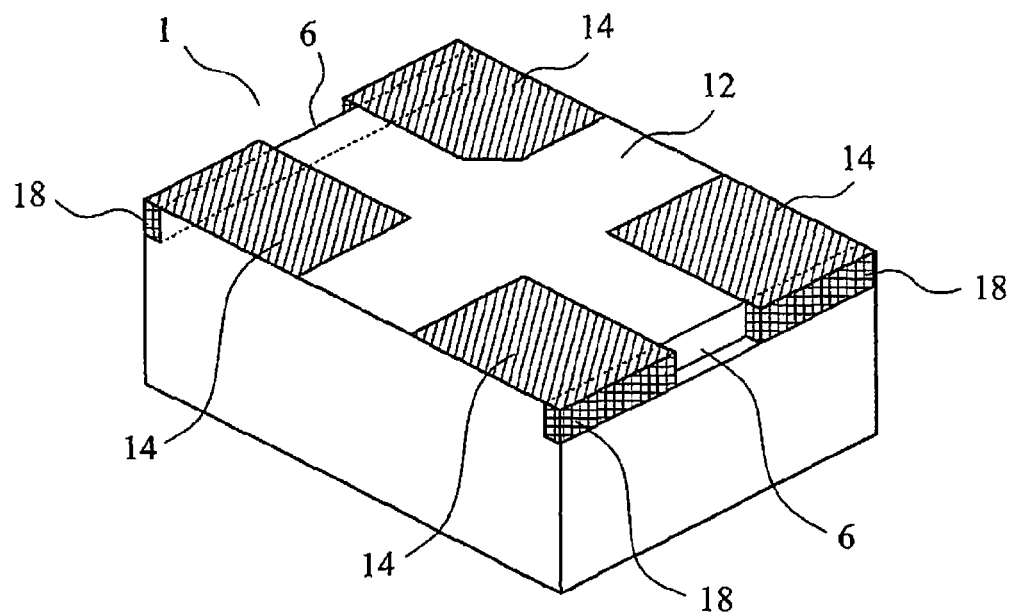
FIG. 21 is a perspective view of a package member showing an exemplary arrangement of external terminals of the present invention when viewed from below.
Figure 22:
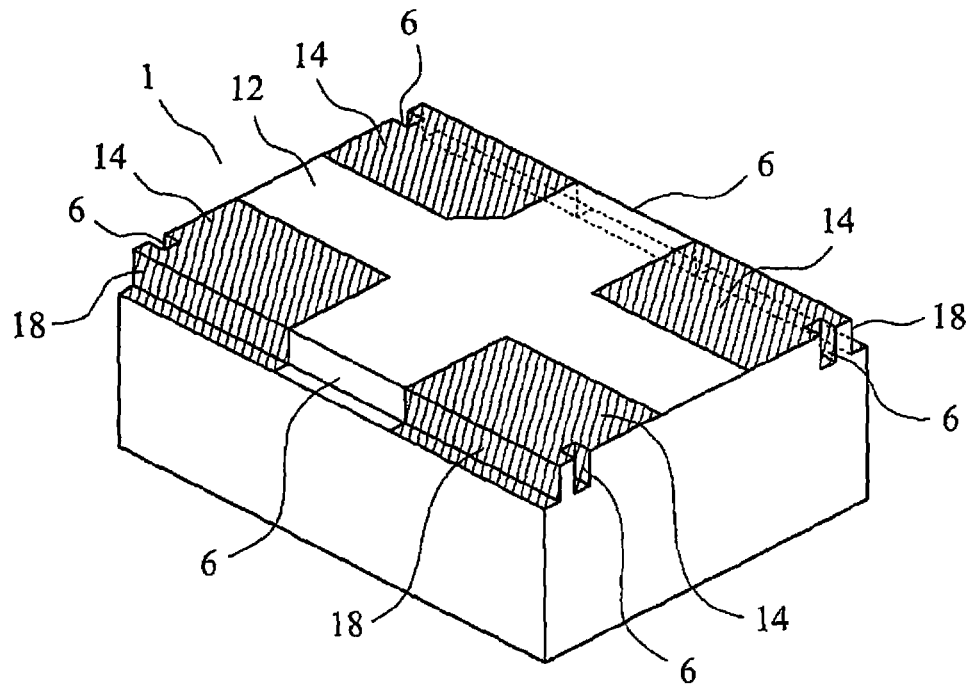
FIG. 22 is a perspective view of a package member showing an exemplary arrangement of external terminals of the present invention when viewed from below.
Figure 23:
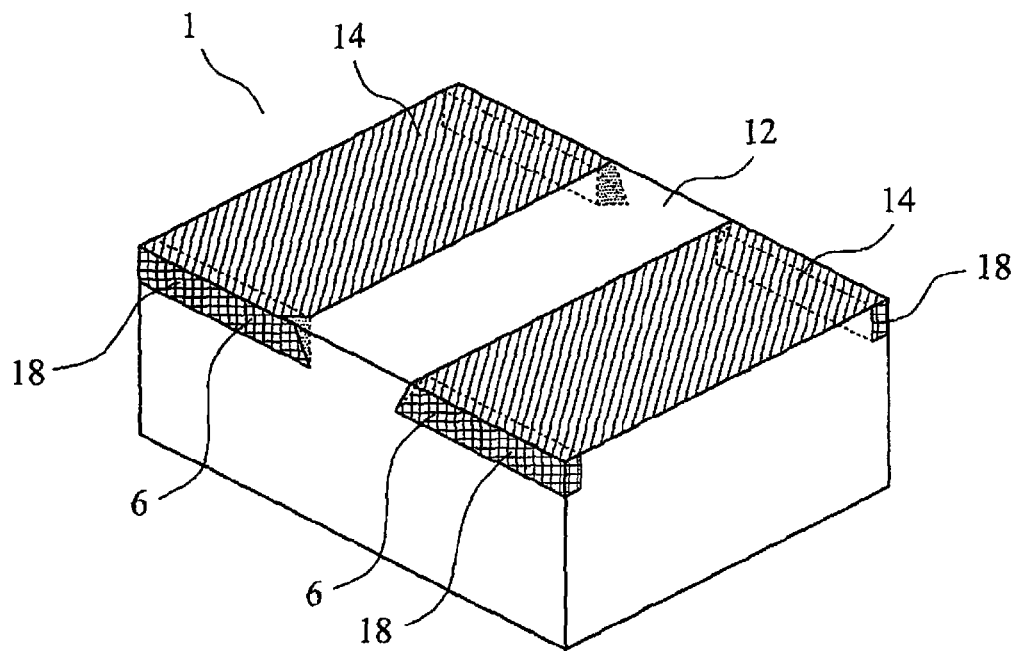
FIG. 23 is a perspective view of a package member showing an exemplary arrangement of external terminals of the present invention when viewed from below.

Furthermore, in the first and the second embodiments described above, the number of external terminals is not limited to two, and may be four as shown in FIG. 21. In the example shown in FIG. 21, engraved portions (the cut-out portions 6) having a length across an entire short side of the package member 1 are formed, and the side-face conductors 18 are formed on portions of the external terminals 14 opposing each other at the cut-out portions 6. Furthermore, in FIGS. 20 and 21, engraved portions (the cut-out portions 6) having a length across an entire short side of the package member 1 are formed, but, as shown in FIG. 22, engraved portions (the cut-out portions 6) having a length across an entire long side of the package member 1 may be formed, and the side-face conductors 18 may be formed on portions of the external terminals 14 opposing each other at the cut-out portions 6. In the cut-out portions 6 shown in FIG. 22, film-like side-face conductors 18 are formed on the surface thereof, and the cut-out portions 6 are not filled with the side-face conductors 18. Furthermore, small cut-out portions 6 are formed also on the short sides of the package 11, and the film-like side-face conductors 18 are formed also on the small cut-out portions 6. With such a configuration, even when the side-face conductors 18 are formed on the cut-out portions 6, the cut-out portions 6 are not filled with the side-face conductors 18, and the external shape of the cut-out portions 6 is clearly seen, and, thus, the bonding properties of solder can be improved by the anchor effect. Here, in FIG. 22, engraved portions (the cut-out portions 6) having a length across an entire long side of the package member 1 are formed, but, as shown in FIG. 23, engraved portions (the cut-out portions 6) may be formed at regions in which the external terminals 14 are formed along the long sides of the package member 1.

Furthermore, two external terminals may be arranged in positional relationships as shown in FIGS. 24 to 28.

Here, in the crystal resonators 1 shown in FIGS. 21 to 28, the package members 1 according to the first embodiment are used, but the packages 1' according to the second embodiment can also provide similar configurations.

Figure 24:
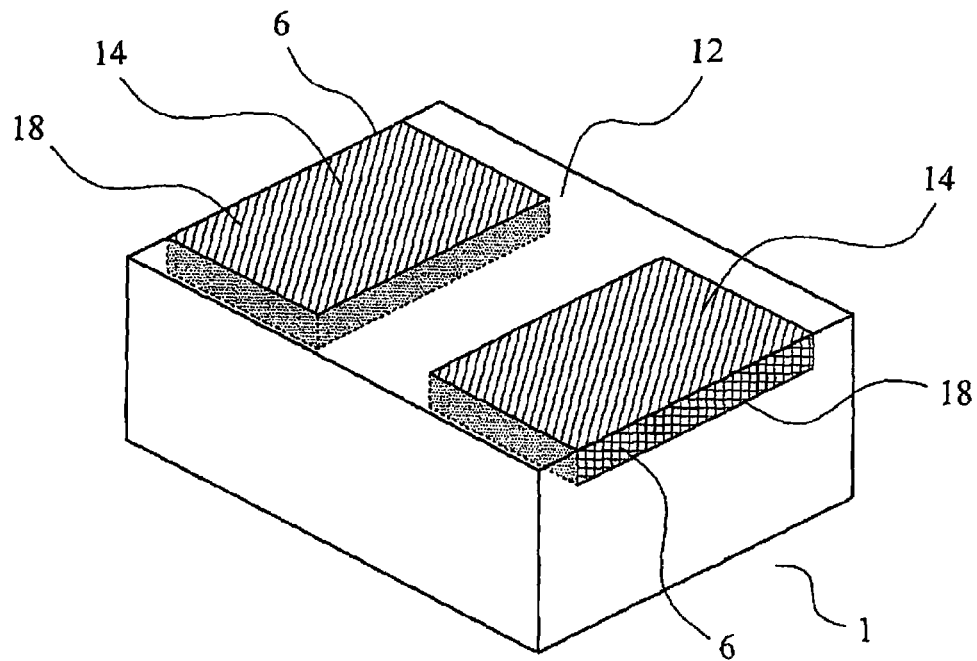
FIG. 24 is a perspective view of a package member showing an exemplary arrangement of external terminals of the present invention when viewed from below.
Figure 25:
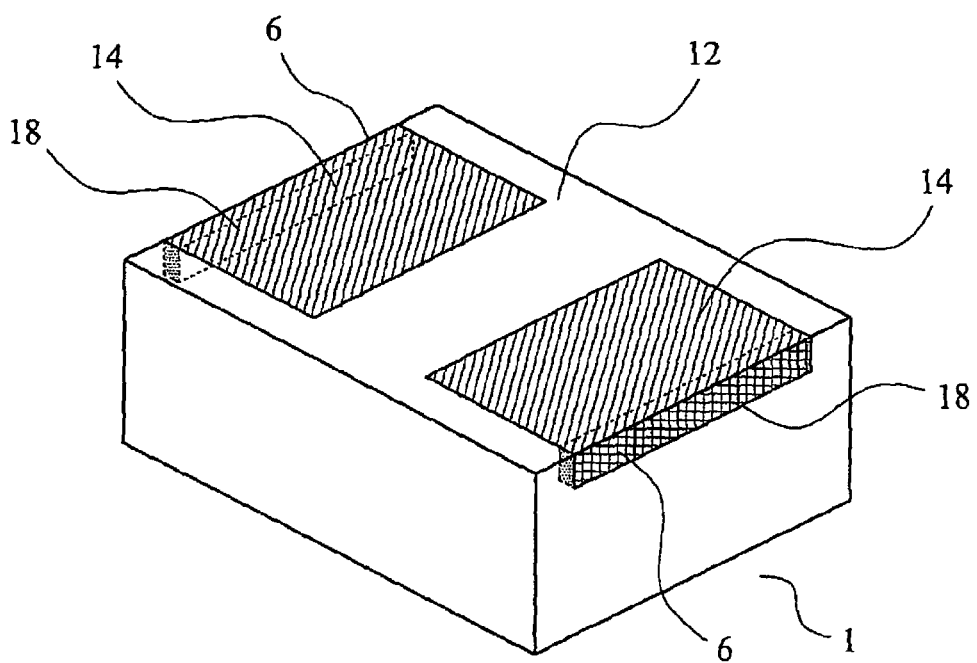
FIG. 25 is a perspective view of a package member showing an exemplary arrangement of external terminals of the present invention when viewed from below.

The external terminals 14 shown in FIGS. 24 and 25 are arranged such that two external terminals 14 exactly oppose each other. In FIG. 24, the external terminals 14 and the side-face conductors 18 are formed by engraving the base material of the package member 1 from the bottom face 12 side substantially in the shape of rectangular solids to form the cut-out portions 6 (recess portions), and filling the recess portions with conductors. When the conductors (the external terminals 14 and the side-face conductors 18) are formed in the cut-out portions 6 obtained by engraving the bottom face (the back main face 12) in the shape of rectangular solids in this manner, the bond strength of the external terminals 14 and the side-face conductors 18 to the base material of the package member 1 can be improved, and the reliability of the package member 1 can be improved. Meanwhile, in FIG. 25, only portions near two short side edge portions are engraved. In this case, the external terminals 14 and the side-face conductors 18 can be formed without increasing the thickness of the bottom face (the back main face 12) of the package member 1, and, thus, a contribution can be made to reductions in the height (thickness) of the package member 1.

Figure 26:
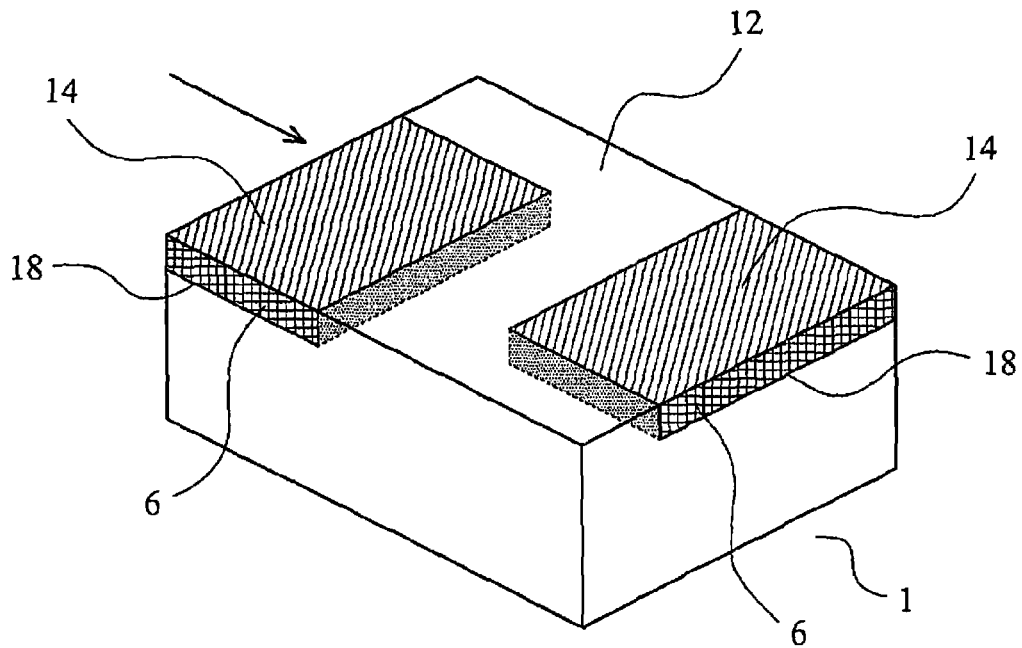
FIG. 26 is a perspective view of a package member showing an exemplary arrangement of external terminals of the present invention when viewed from below.
Figure 27:
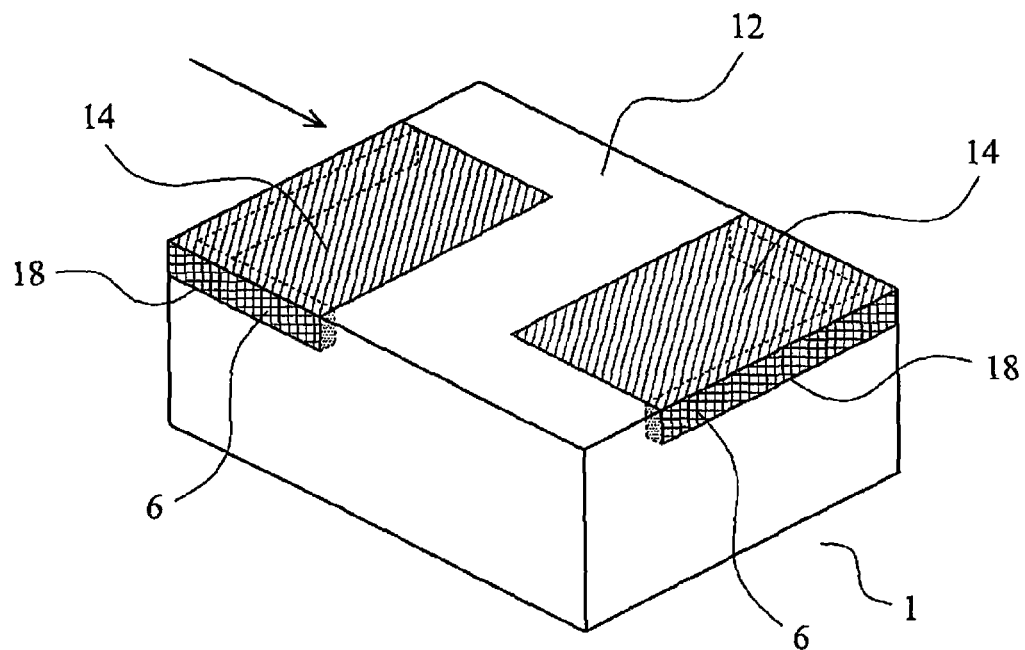
FIG. 27 is a perspective view of a package member showing an exemplary arrangement of external terminals of the present invention when viewed from below.
Figure 28:
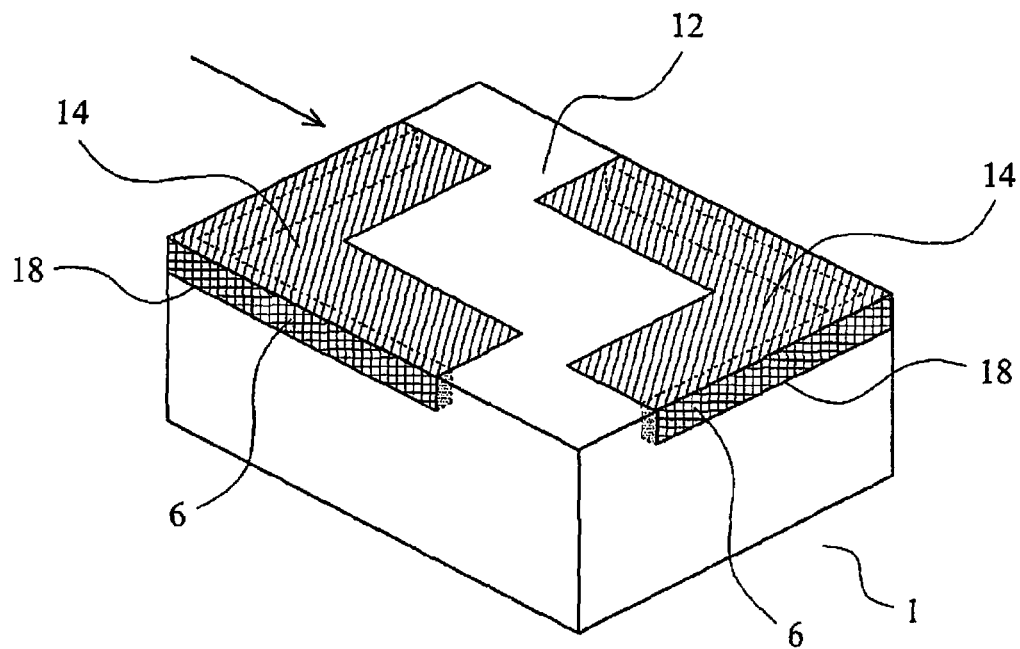
FIG. 28 is a perspective view of a package member showing an exemplary arrangement of external terminals of the present invention when viewed from below.

In FIGS. 26 to 28, two external terminals having a shape of a rectangle 14 are formed along opposite sides of the bottom face 12 of the package member 1, and arranged so as to be symmetrical about the center of the bottom face 12. Furthermore, the external terminals 14 are arranged so as to partially overlap each other when viewed from one side (in a direction perpendicular to the opposite sides, see the arrow direction in FIGS. 26 to 28).

Figure 29:
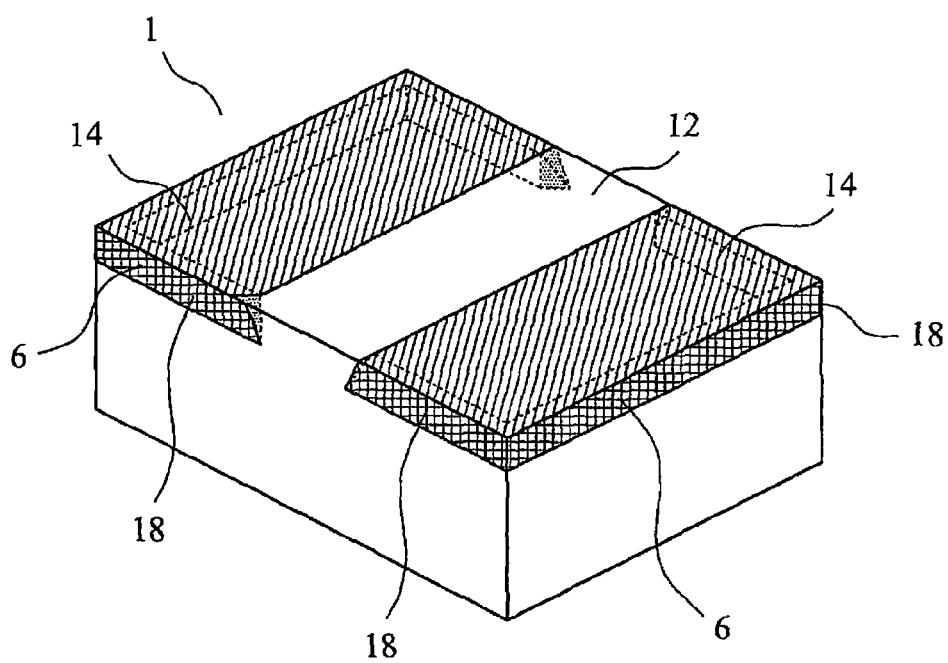
FIG. 29 is a perspective view of a package member showing an exemplary arrangement of external terminals of the present invention when viewed from below.

Furthermore, the cut-out portion 6 according to the first and the second embodiments described above is formed on one side or two sides of the back main face 12, but the present invention is not limited to this, and, as shown in FIG. 29, the external terminals 14 may be arranged such that two external terminals 14 exactly oppose each other. Furthermore, in the example shown in FIG. 29, three sides consisting of a short side of the back main face 12 and opposite long sides formed continuously to both ends of the short side are engraved to form a cut-out portion 6 in the shape of a C along the periphery of the back main face 12. In the cut-out portion 6 shown in FIG. 29, the side-face conductor 18 is formed, and the side-face conductor 18 and the external terminal 14 are integrally formed. According to such an example shown in FIG. 29, the cut-out portion 6 is formed on three sides consisting of a short side and opposite long sides formed continuously to both ends of the short side, and, thus, the bond strength of the external terminals 14 and the side-face conductors 18 to the base material of the package member 1 can be improved, and the reliability of the package member 1 can be improved.

Figure 30:
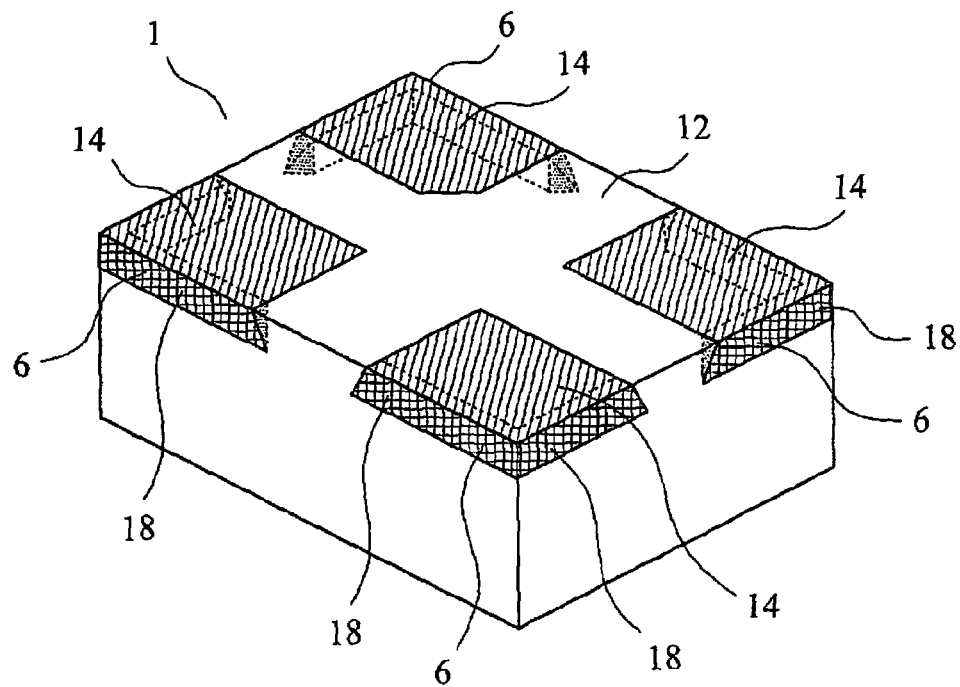
FIG. 30 is a perspective view of a package member showing an exemplary arrangement of external terminals of the present invention when viewed from below.

Furthermore, in the first and the second embodiments described above, the external terminals are two terminals, but may be four terminals as shown in FIG. 30.

Figure 31:
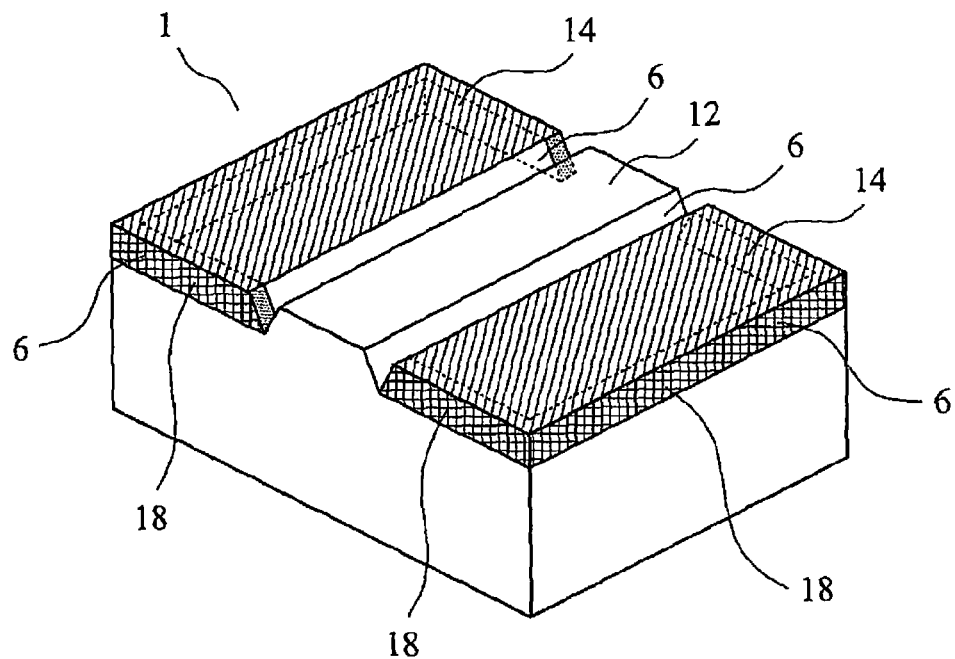
FIG. 31 is a perspective view of a package member showing an exemplary arrangement of external terminals of the present invention when viewed from below.
Figure 32:
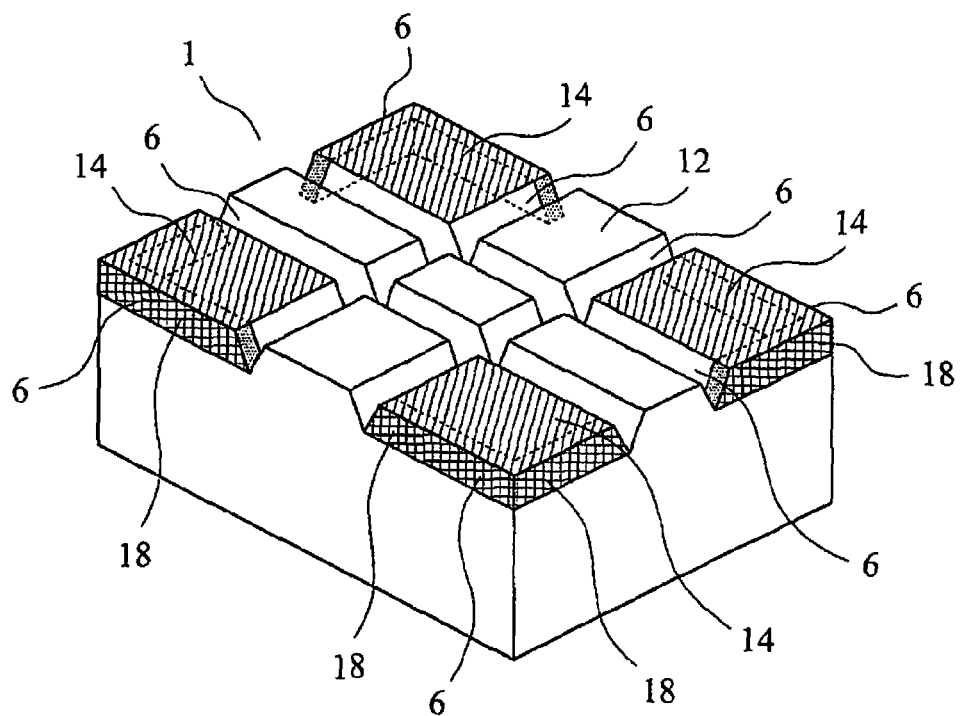
FIG. 32 is a perspective view of a package member showing an exemplary arrangement of external terminals of the present invention when viewed from below.

Furthermore, in the first and the second embodiments described above, the cut-out portions 6 are formed by engraving the outer side faces of the package member 1 or 1' inward, but the present invention is not limited to this shape of the cut-out portions 6, and they may be formed at any position on the package member 1 or 1' as shown in FIGS. 31 and 32 as long as the side-face conductors 18 of the external terminals 14 can be formed.

Figure 33:
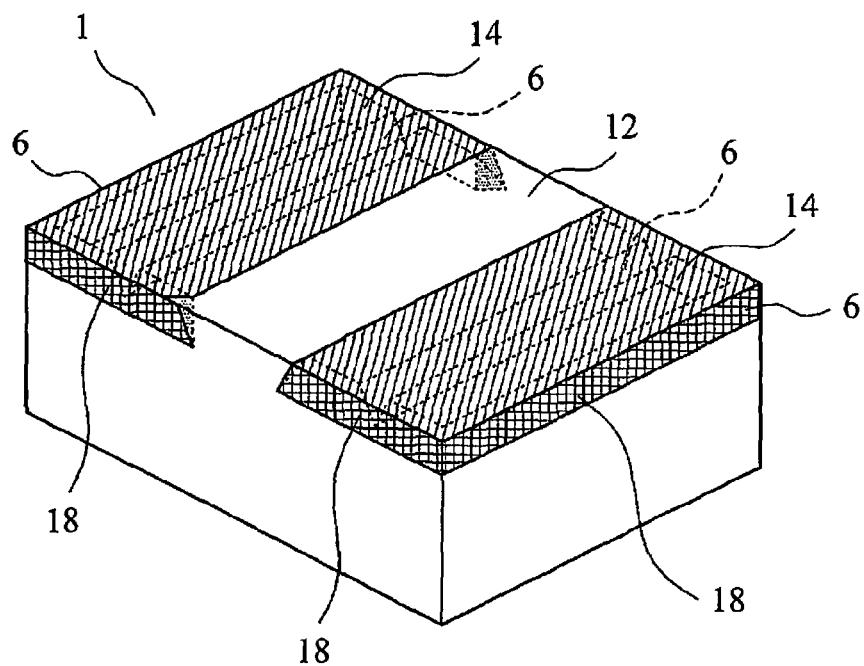
FIG. 33 is a perspective view of a package member showing an exemplary arrangement of external terminals of the present invention when viewed from below.

In the examples shown in FIGS. 31 and 32, the cut-out portions 6 are formed by engraving the package member 1 along the peripheries of the external terminals 14 formed on the back main face 12. With these configurations, the cut-out ends of the cut-out portions 6 formed on the outer side faces of the package member 1 or 1' have flat faces, and the cut-out ends of the cut-out portions 6 formed only on the back main face 12 of the package member 1 have V-shaped grooves. Furthermore, the present invention is not limited to the configuration of the examples shown in FIGS. 31 and 32, and, as shown in FIG. 33, further cut-out portions 6 may be formed along the short side direction at (the central positions of) the external terminals 14 formed on the back main face 12 of the package member 1. Furthermore, the surfaces of the external terminals 14 may be flat, or may be rough. When the back main face 12 is formed rough in this manner, the bond strength of solder can be improved by the anchor effect.

When a pair of external terminals 14 are arranged on the bottom face 12 in such a positional relationship, the bonding reliability between the piezoelectric resonator device (the crystal resonator 5) and a substrate inside an electronic apparatus or the like can be improved. The reason for this is that it is possible to suppress cracks caused by stress generated in solder that bonds the package member 1 and the substrate together, the stress being generated due to a difference between their coefficients of thermal expansion. Furthermore, in the reflow process, melted solder on the substrate not only bonds the external terminals 14 and the substrate together but also forms solder fillets (rising portions) on the side-face conductors 18. Accordingly, the contact area between the crystal resonator 5 and the solder is increased, and the crystal resonator 5 can be supported in two directions (the planar directions of the external terminals 14 and the side-face conductors 18, i.e., two directions). Accordingly, the bond strength between the crystal resonator 5 and the substrate can be improved. Accordingly, the bond strength between the crystal resonator 5 and the substrate can be improved.

In the first and the second embodiments described above, gold is used in a region of the crystal resonator plate 2 bonded to the package member 1 or 1', and gold and tin (or gold-tin alloy) are used in a region of the package member 1 or 1' bonded to the crystal resonator plate 2. However, the application of the present invention is not limited to this combination, and other combinations may be also employed. That is to say, combinations of other metals forming eutectic alloy may be also employed, such as gold and germanium, gold and silicon, silver and germanium, or silver and silicon. Furthermore, in the first embodiment, the crystal resonator plate 2 and the package member 1 may be conductively bonded using a conductive resin adhesive containing metal fillers.

Figure 34:
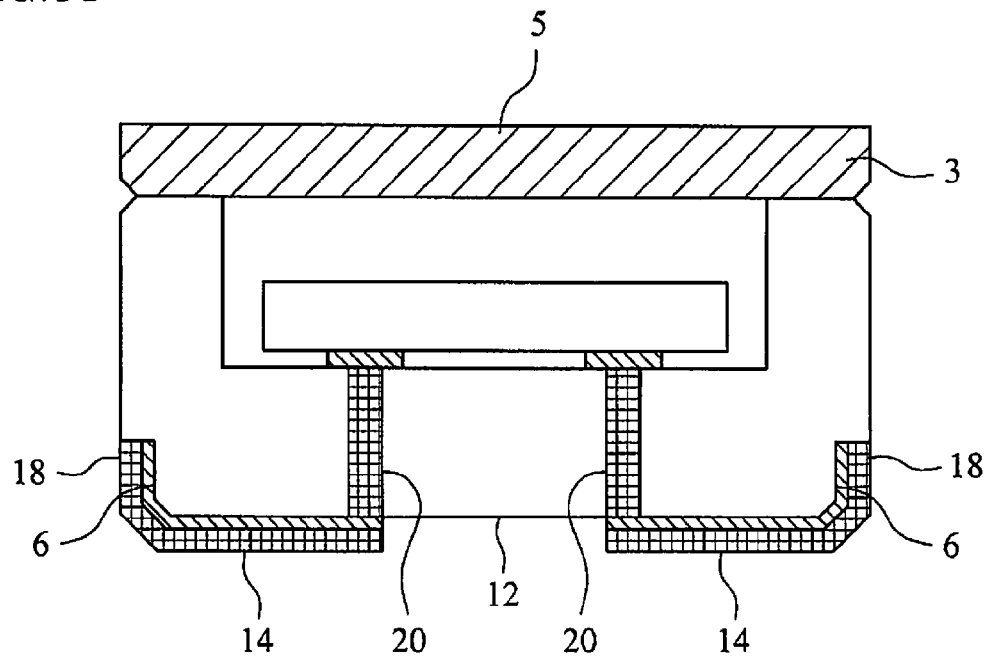
FIG. 34 is a schematic cross-sectional view showing a crystal resonator according to a modified example of the present invention.

Furthermore, in the first and the second embodiments described above, the main faces (e.g., see the back main face 12) and the side faces of the package member 1 or 1' and the lid 3 are perpendicular to each other, but the present invention is not limited to this, and a configuration may be adopted in which, as shown in FIG. 34, at least one face of the main faces and the side faces of the package member 1 and the lid 3 is tapered, and the main faces (see the back main face 12) and the side faces of the package member 1 and the lid 3 are not perpendicular to each other in the tapered portion.

Figure 35:
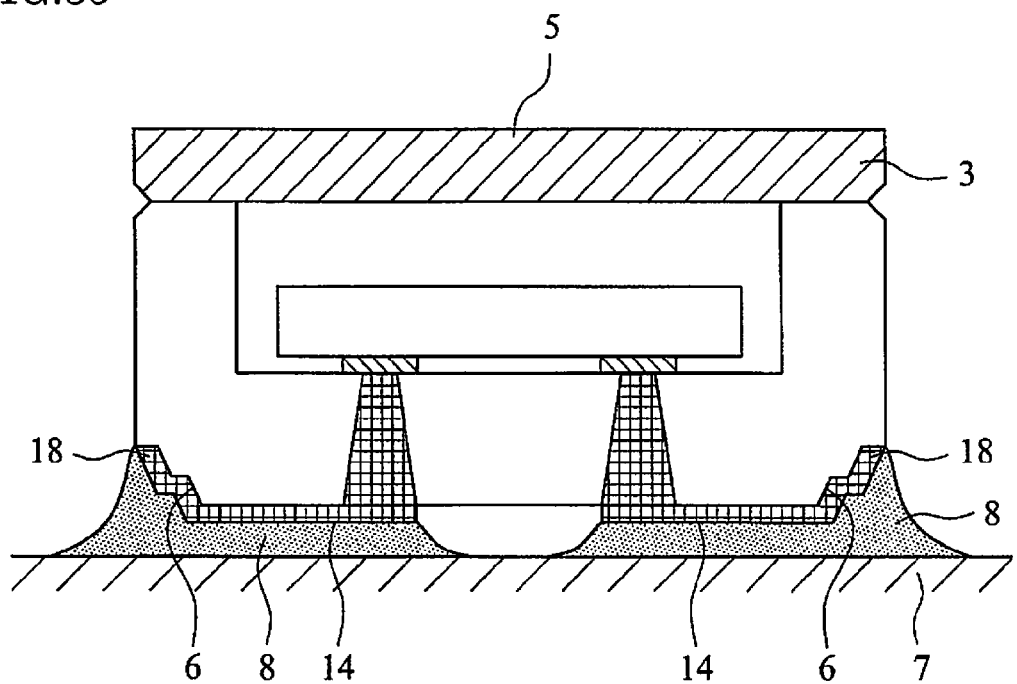
FIG. 35 is a schematic cross-sectional view showing a crystal resonator according to a modified example of the present invention.

Furthermore, the present invention is not limited to the configuration of the example shown in FIG. 34, and, as shown in FIG. 35, the cut-out portions 6 formed on the package member 1 may have steps. In the example shown in FIG. 35, the cut-out portions 6 are tapered, and steps are formed at the middle of the tapered cut-out portions 6 when viewed from a side. The side-face conductors 18 are formed on the cut-out portions 6, and steps are formed also on the surfaces of the side-face conductors 18. Here, the steps of the cut-out portions 6 do not have to be tapered, and may be right-angled steps having an inner wall face rising up in a vertical direction and an inner bottom face extending from the inner wall face in a horizontal direction as shown in FIG. 18. When steps are formed on the cut-out portions 6 in this manner, an anchor effect is obtained, and the bonding reliability of the solder 8 (brazing filler metal) used in bonding to the substrate 7 can be improved.

Figure 36:
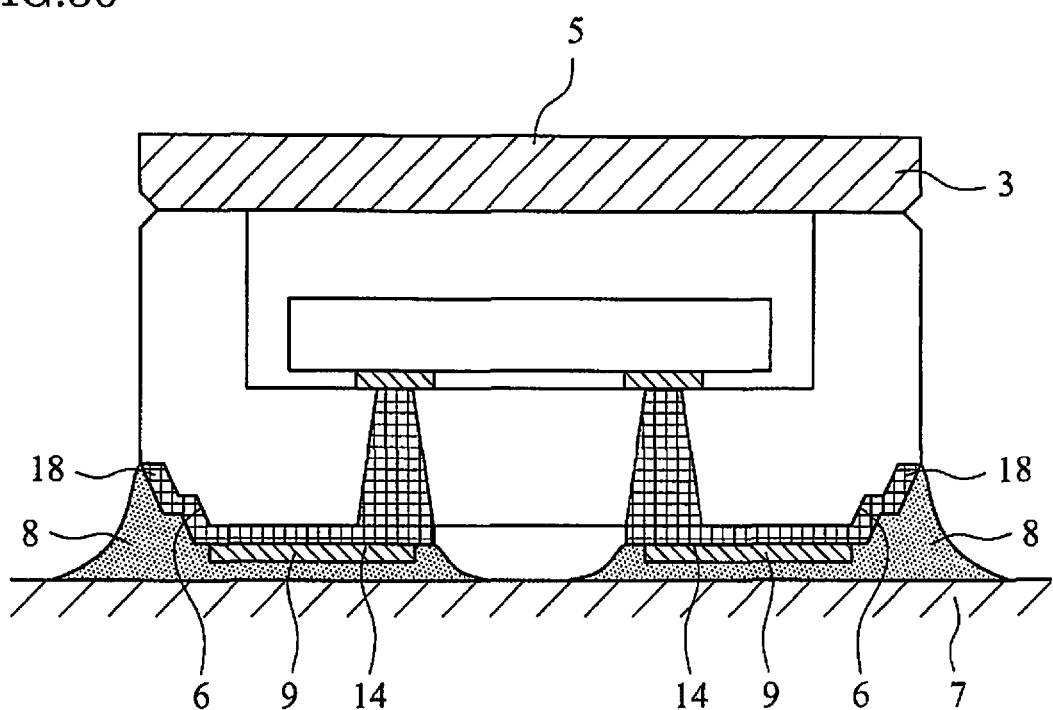
FIG. 36 is a schematic cross-sectional view showing a crystal resonator according to a modified example of the present invention.

Furthermore, as shown in FIG. 36, conductive bumps 9 made of metal films may be formed on the external terminals 14 of the package member 1 shown in FIG. 35. In this case, not only an anchor effect is obtained because steps are formed on the cut-out portions 6, but also an action that buffers stress generated when heating the solder 8 (brazing filler metal) for bonding is obtained because the bumps 9 are formed, and, thus, the bonding reliability of the solder 8 used in bonding to the substrate 7 can be improved. In particular, when the bumps 9 are formed continuously to the steps of the cut-out portions 6 as shown in FIG. 36, the bond strength can be further improved, and, even if cracks and the like occur in the solder 8, the cracks can be prevented from being larger, and, thus, a high bonding reliability can be secured. Here, the bumps 9 can be applied to all of the above-described embodiments in which the cut-out portions 6 are provided.

In the embodiments of the present invention, a surface-mounted crystal resonator is used as an example, but the present invention can be applied to methods for manufacturing other surface-mounted piezoelectric resonator devices used in electronic apparatuses and the like, such as crystal filters and crystal oscillators in which a crystal resonator is installed in an electronic component such as an integrated circuit.

The present invention may be embodied in various other forms without departing from the spirit or essential characteristics thereof. The embodiments disclosed in this application are to be considered in all respects as illustrative and not limiting. The scope of the invention is indicated by the appended claims rather than by the foregoing description. All variations and modifications falling within the equivalency range of the appended claims are intended to be embraced therein.

Furthermore, this application claims priority based on Patent Application No. 2009-090623 filed in Japan on Apr. 3, 2009, the entire contents of which are herein incorporated by reference.

INDUSTRIAL APPLICABILITY

The present invention can be applied to mass production of piezoelectric resonator devices.

DESCRIPTION OF REFERENCE NUMERALS

1 Package member
10 Package member assembly
110 Inner bottom face
11 Front main face (wafer)
12 Back main face (wafer)
13 Mounting electrode
130, 140 Vapor-deposited layer
141 Plated layer
14 External terminal
15, 16 Bottomed hole
170 Bank portion upper face
17 Bank portion
18 Side-face conductor
19 Through hole
20 Via
2 Crystal resonator plate
3 Lid
4 Bonding material
5 Crystal resonator
6 Cut-out portion
7 Substrate
8 Solder
9 Bump

The invention claimed is:

1. A package member assembly in which a plurality of package members are integrally formed from repeating rectangular sections, the package members being rectangular when viewed from above,
   wherein a plurality of bottomed holes are formed on at least a back main face of a wafer made of glass or crystal,
   the bottomed holes are formed along a periphery of the back main face of each repeating rectangular section and on two adjacent sides of the back main face of each repeating rectangular section,
   a plurality of external terminals are formed on the back main face of the wafer, and the external terminals are connected to side-face conductors attached to inner wall faces of the bottomed holes on the back main face of each repeating rectangular section.

2. A method for manufacturing the package member assembly having repeated rectangular package member sections according to claim 1, comprising:
   a bottomed hole forming step of forming a plurality of bottomed holes on at least a back main face of a wafer made of glass or crystal;
   a vapor-deposited layer forming step of forming vapor-deposited layers at least on portions around the bottomed holes on the back main face, and on inner wall faces and inner bottom faces of the bottomed holes on the back main face; and
   a plated layer forming step of forming plated layers on the vapor-deposited layers on the inner wall faces of the bottomed holes on the back main face, and on the vapor-deposited layers formed continuously to said vapor-deposited layers and positioned around the bottomed holes on the back main face, thereby filling bottomed holes located at each corner of each rectangular package member.

3. The method of manufacturing the package member assembly according to claim 2, wherein the filled bottomed holes located at each corner of each rectangular package member are connected to and continuous with plated bottom surfaces.

4. A method for manufacturing a piezoelectric resonator device having a package member, a piezoelectric resonator plate, and a lid, comprising:
   a mounting step of mounting, on a front main face side of the package member assembly according to claim 1, a plurality of piezoelectric resonator plates on which excitation electrodes are formed;
   a sealing step of hermetically sealing the excitation electrodes by bonding a plurality of lids to the package member assembly or the plurality of piezoelectric resonator plates, each lid corresponding to one repeating rectangular package member section having a bottomed hole at each of four corners of the rectangular shape, each bottomed hole being filled with conductive material; and a dividing step of cutting the package member assembly along virtual lines passing through the bottomed holes on the back main face of the package member assembly to provide a plurality of piezoelectric resonator devices, each corresponding to a repeating rectangular package member and having a filled cut out portion at two or more rectangular corners.

5. A package member employing glass or crystal as a base material and having a shape of a rectangle when viewed from above, comprising:

a plurality of external terminals provided on a bottom face of the package member;

and a plurality of cut-out portions provided on an outer side face of the package member wherein each external terminal comprises at least two side face conductors filled with conductive material, the two side face conductors forming a corner of the package member;

wherein the cut-out portions are formed along a periphery of a back main face and on two adjacent sides of the back main face, side-face conductors are attached to inner wall faces of the cut-out portions or fill the cut-out portions that extend parallel to the lower surface of the package member to a neighborhood of a middle point of each side, and connect to the external terminals.

6. The package member according to claim 5, wherein opposite sides are formed on the bottom face of the package member, and at least two external terminals having a shape of a rectangle are formed along the opposite sides, and the at least two external terminals are arranged so as to be symmetrical about a center of the bottom face, and so as to partially overlap each other when viewed from one side.

7. The package member according to claim 5, wherein the two filled side face conductors are adjacent to and continuous with plated bottom surfaces.

* * * * *